(12) United States Patent
Liao et al.

(10) Patent No.: US 11,532,718 B2
(45) Date of Patent: Dec. 20, 2022

(54) FINFET HAVING A GATE DIELECTRIC COMPRISING A MULTI-LAYER STRUCTURE INCLUDING AN OXIDE LAYER WITH DIFFERENT THICKNESSES ON SIDE AND TOP SURFACES OF THE FINS

(71) Applicant: Taiwan Semiconductor Manufacturing Co., Ltd., Hsinchu (TW)

(72) Inventors: Chen-Hsuan Liao, Hsinchu (TW); Chih-Chung Chang, Nantou County (TW); Chun-Heng Chen, Hsinchu (TW); Jiun-Ming Kuo, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/942,781

(22) Filed: Jul. 30, 2020

(65) Prior Publication Data
US 2022/0037487 A1    Feb. 3, 2022

(51) Int. Cl.
| | |
|---|---|
| H01L 29/423 | (2006.01) |
| H01L 29/78 | (2006.01) |
| H01L 29/66 | (2006.01) |
| H01L 21/28 | (2006.01) |
| H01L 21/8234 | (2006.01) |
| H01L 29/51 | (2006.01) |
| H01L 27/088 | (2006.01) |

(52) U.S. Cl.
CPC .. *H01L 29/42368* (2013.01); *H01L 21/28185* (2013.01); *H01L 21/28194* (2013.01); *H01L 21/823462* (2013.01); *H01L 29/6681* (2013.01); *H01L 29/66795* (2013.01); *H01L 29/7843* (2013.01); *H01L 29/7851* (2013.01); *H01L 29/7854* (2013.01); *H01L 29/7856* (2013.01); *H01L 27/0886* (2013.01); *H01L 29/513* (2013.01)

(58) Field of Classification Search
CPC ..... H01L 21/823431; H01L 21/823437; H01L 21/823462; H01L 29/42368; H01L 29/513; H01L 29/6681; H01L 29/7848; H01L 29/7851; H01L 29/7854; H01L 27/0886

See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,796,666 B1 | 8/2014 | Huang et al. |
| (Continued) | | |

*Primary Examiner* — Marcos D. Pizarro
(74) *Attorney, Agent, or Firm* — JCIPRNET

(57) ABSTRACT

A semiconductor device includes a substrate, a plurality of insulators, a liner structure and a gate stack. The substrate has fins and trenches in between the fins. The insulators are disposed within the trenches of the substrate. The liner structure is disposed on the plurality of insulators and across the fins, wherein the liner structure comprises sidewall portions and a cap portion, the sidewall portions is covering sidewalls of the fins, the cap portion is covering a top surface of the fins and joined with the sidewall portions, and a maximum thickness $T_1$ of the cap portion is greater than a thickness $T_2$ of the sidewall portions. The gate stack is disposed on the liner structure and across the fins.

20 Claims, 26 Drawing Sheets

(56) References Cited

U.S. PATENT DOCUMENTS

| | | |
|---|---|---|
| 8,815,712 B2 | 8/2014 | Wan et al. |
| 8,816,444 B2 | 8/2014 | Wann et al. |
| 8,823,065 B2 | 9/2014 | Wang et al. |
| 8,860,148 B2 | 10/2014 | Hu et al. |
| 8,963,258 B2 | 2/2015 | Yu et al. |
| 9,093,530 B2 | 7/2015 | Huang et al. |
| 9,105,490 B2 | 8/2015 | Wang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,236,300 B2 | 1/2016 | Liaw |
| 9,520,482 B1 | 12/2016 | Chang et al. |
| 9,548,303 B2 | 1/2017 | Lee et al. |
| 9,576,814 B2 | 2/2017 | Wu et al. |
| 2011/0278676 A1* | 11/2011 | Cheng ................. H01L 27/1211 438/585 |
| 2019/0164840 A1* | 5/2019 | Ching ................. H01L 29/0847 |

\* cited by examiner

FINFET HAVING A GATE DIELECTRIC COMPRISING A MULTI-LAYER STRUCTURE INCLUDING AN OXIDE LAYER WITH DIFFERENT THICKNESSES ON SIDE AND TOP SURFACES OF THE FINS

BACKGROUND

As the semiconductor devices keep scaling down in size, three-dimensional multi-gate structures, such as the fin-type field effect transistor (FinFET), have been developed to replace planar CMOS devices. A characteristic of the Fin-FET device lies in that the structure has one or more silicon-based fins that are wrapped around by the gate to define the channel of the device. The gate wrapping structure further provides better electrical control over the channel.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
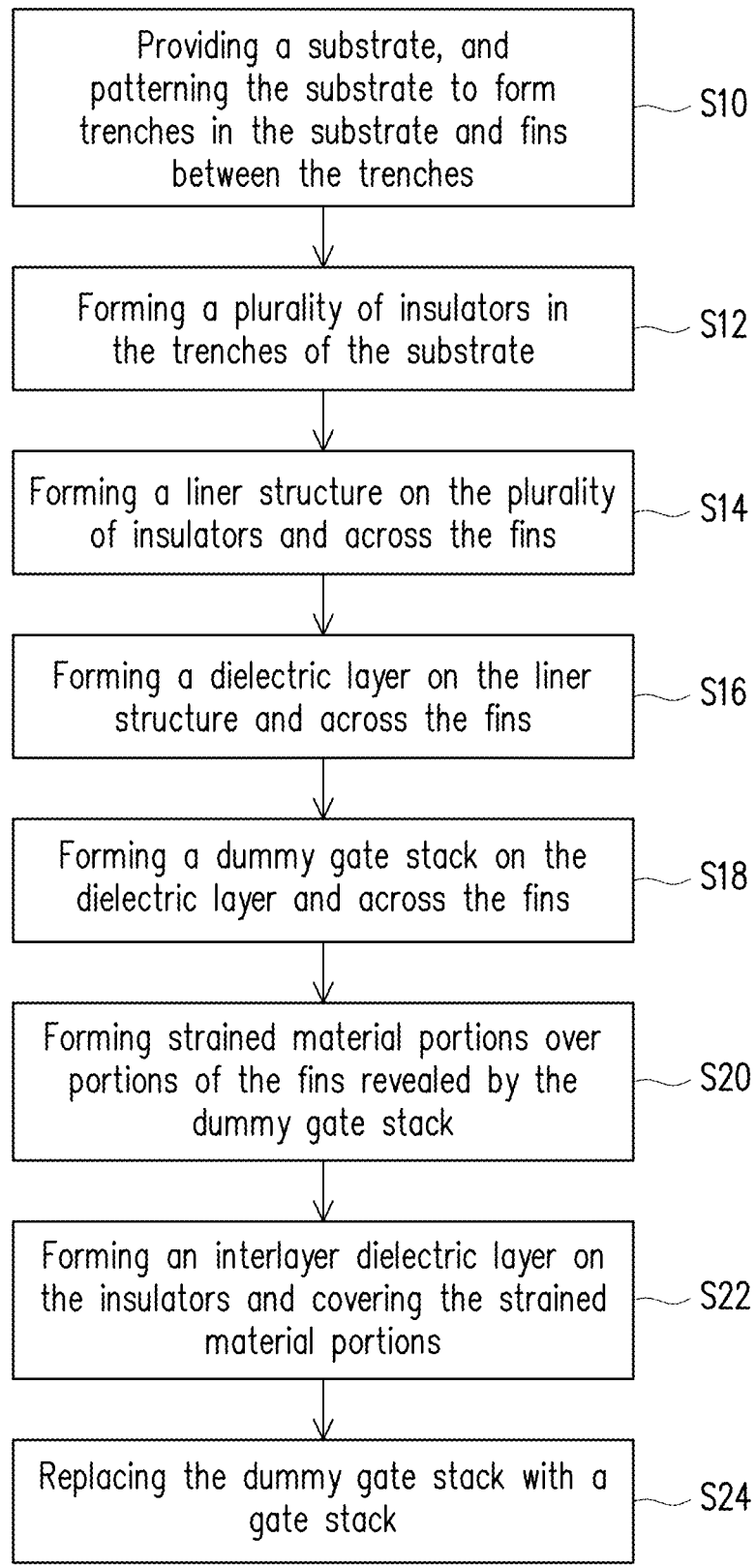
FIG. 1 is an exemplary flow chart showing the process steps of a method of fabricating a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The embodiments of the present disclosure describe the exemplary manufacturing processes of a three-dimensional structure with height differences and the structure(s) fabricated there-from. Certain embodiments of the present disclosure describe the exemplary manufacturing processes of fin field-effect transistor (FinFET) devices and the FinFET devices fabricated there-from. The FinFET device may be formed on a monocrystalline semiconductor substrate, such as a bulk silicon substrate in certain embodiments of the present disclosure. In some embodiments, the FinFET device may be formed on a silicon-on-insulator (SOI) substrate or a GOI (germanium-on-insulator) substrate as alternatives. Also, in accordance with the embodiments, the silicon substrate may include other conductive layers, doped regions or other semiconductor elements, such as transistors, diodes or the like. The embodiments are intended to provide further explanations but are not used to limit the scope of the present disclosure.

FIG. 1 is an exemplary flow chart showing the process steps of a method of fabricating a semiconductor device in accordance with some embodiments of the present disclosure. The various process steps of the process flow illustrated in FIG. 1 may comprise multiple process steps as discussed below. FIG. 2 to FIG. 12B are the perspective views and cross-sectional views illustrating various stages of a method of fabricating semiconductor devices in accordance with some embodiments of the disclosure. It is to be noted that the process steps described herein cover a portion of the manufacturing processes used to fabricate a semiconductor device, such as a FinFET device.

Figure 2:
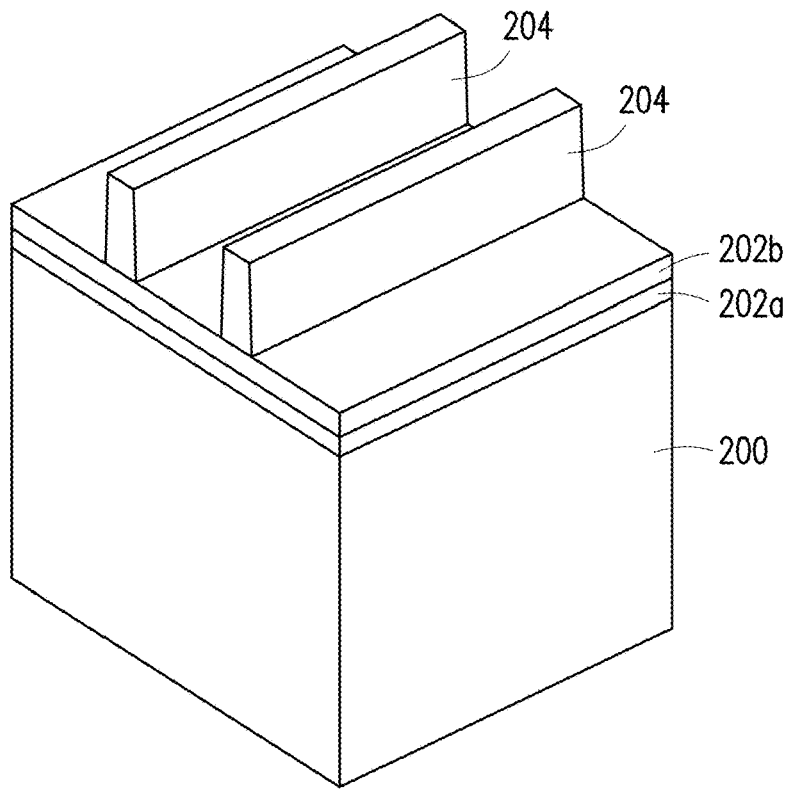
FIG. 2 to FIG. 12B are the perspective views and cross-sectional views illustrating various stages of a method of fabricating semiconductor devices in accordance with some embodiments of the disclosure.

FIG. 2 is a perspective view of the semiconductor device at one of various stages of the manufacturing method. In step S10 in FIG. 1 and as shown in FIG. 2, a semiconductor substrate 200 is provided. In one embodiment, the semiconductor substrate 200 comprises a crystalline silicon substrate (e.g., wafer). The semiconductor substrate 200 may comprise various doped regions depending on design requirements (e.g., p-type semiconductor substrate or n-type semiconductor substrate). In some embodiments, the doped regions may be doped with p-type or n-type dopants. For example, the doped regions may be doped with p-type dopants, such as boron or BF2; n-type dopants, such as phosphorus or arsenic; and/or combinations thereof. The doped regions may be configured for an n-type FinFET, or alternatively configured for a p-type FinFET. In some alternative embodiments, the semiconductor substrate 200 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

In one embodiment, a pad layer 202a and a mask layer 202b are sequentially formed on the semiconductor substrate 200. The pad layer 202a may be a silicon oxide thin film formed, for example, by thermal oxidation process. The pad layer 202a may act as an adhesion layer between the semiconductor substrate 200 and the mask layer 202b. The pad layer 202a may also act as an etch stop layer for etching the mask layer 202b. In at least one embodiment, the mask layer 202b is a silicon nitride layer formed, for example, by low-pressure chemical vapor deposition (LPCVD) or plasma enhanced chemical vapor deposition (PECVD). The mask layer 202b is used as a hard mask during subsequent photolithography processes. In certain embodiments, a patterned photoresist layer 204 having a predetermined pattern is formed on the mask layer 202b.

Figure 3:
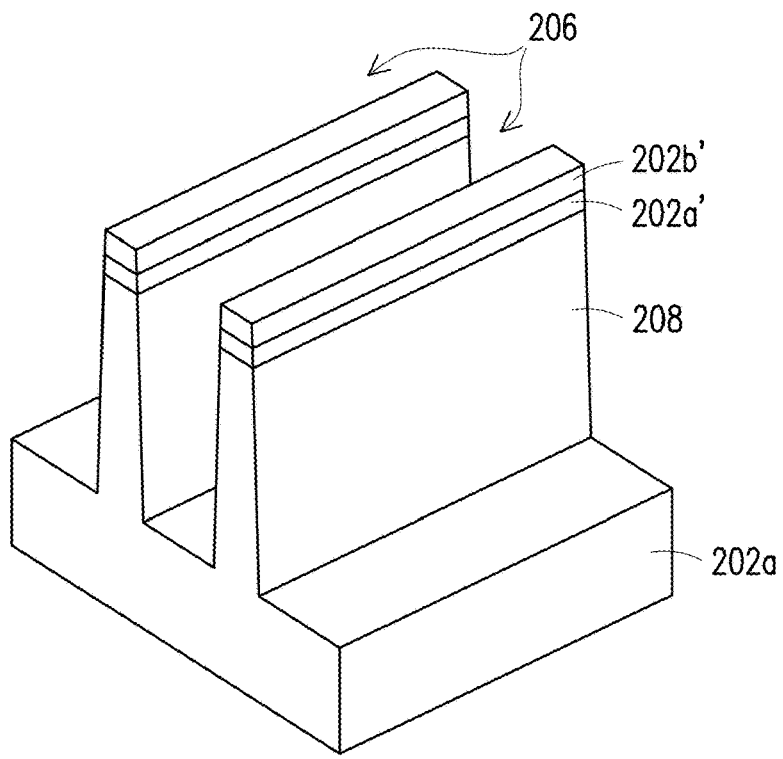

FIG. 3 is a perspective view of the semiconductor device at one of various stages of the manufacturing method. In step S10 in FIG. 1 and as shown in FIG. 3, the substrate 200 is patterned to form trenches 206 in the substrate 200 and fins 208 are formed between the trenches 206. For example, the mask layer 202b and the pad layer 202a which are not covered by the patterned photoresist layer 204 are sequentially etched to form a patterned mask layer 202b' and a patterned pad layer 202a' so as to expose the underlying semiconductor substrate 200. By using the patterned mask layer 202b', the patterned pad layer 202a' and the patterned photoresist layer 204 as a mask, portions of the semiconductor substrate 200 are exposed and etched to form the trenches 206 and the semiconductor fins 208. In some embodiments, the semiconductor fins 208 are covered by the patterned mask layer 202b', the patterned pad layer 202a' and the patterned photoresist layer 204. Two adjacent trenches 206 are spaced apart by a spacing. For example, the spacing between trenches 206 may be smaller than about 30 nm. In other words, two adjacent trenches 206 are spaced apart by a corresponding semiconductor fin 208. The number of the fins 208 shown in FIG. 3 is merely for illustration, in some alternative embodiments, two or more parallel semiconductor fins may be formed in accordance with actual design requirements.

In some embodiments, a height of the semiconductor fins 208 and the depth of the trench 206 range from about 5 nm to about 500 nm. After the trenches 206 and the semiconductor fins 208 are formed, the patterned photoresist layer 204 is then removed. In one embodiment, a cleaning process may be performed to remove a native oxide of the semiconductor substrate 200a and the semiconductor fins 208. The cleaning process may be performed using diluted hydrofluoric (DHF) acid or other suitable cleaning solutions.

Figure 4:
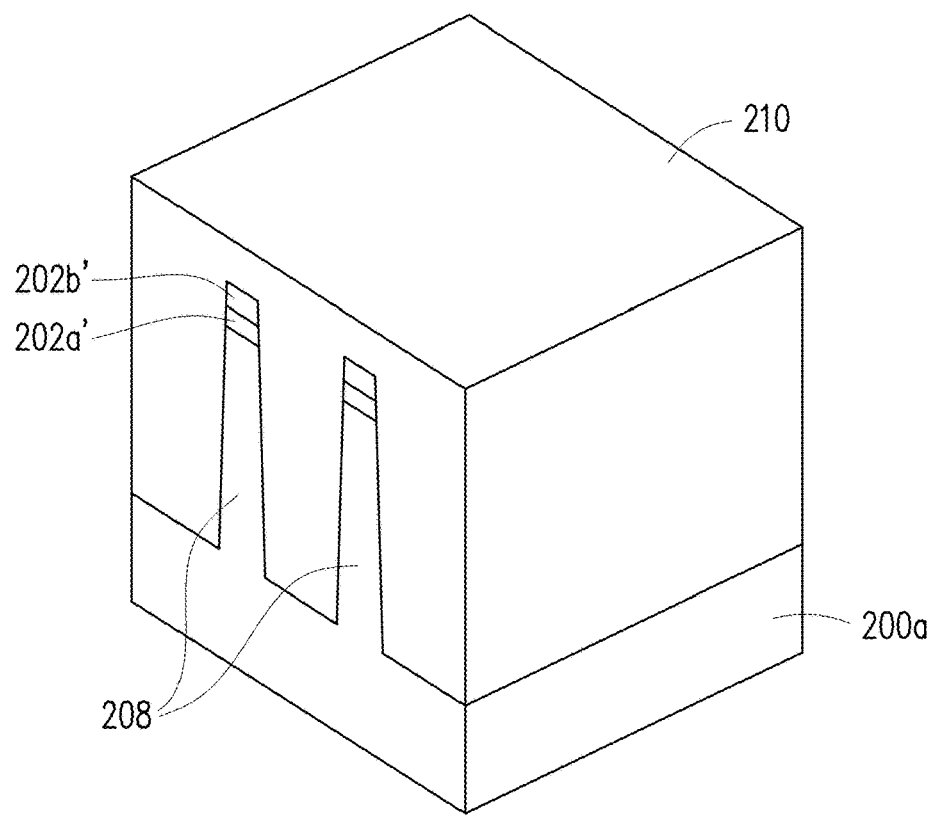
Figure 5:
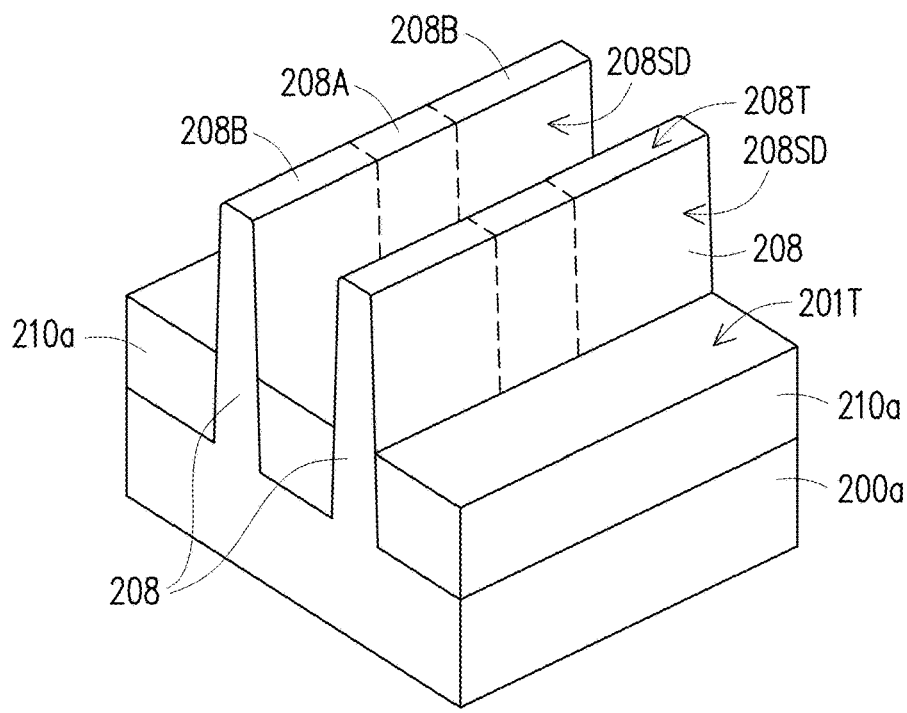

FIG. 4 and FIG. 5 are perspective views of the semiconductor device at one of various stages of the manufacturing method. In step S12 in FIG. 1 and as shown in FIG. 4 to FIG. 5, a plurality of insulators 210a are formed in the trenches 206 of the semiconductor substrate 200a. As illustrated in FIG. 4, in some embodiments, an insulating material 210 is first formed over the semiconductor substrate 200a to cover the semiconductor fins 208 and to fill up the trenches 206. Besides covering the semiconductor fins 208, the insulating material 210 is also covering the patterned pad layer 202a' and the patterned mask layer 202b'. In some embodiments, the insulating material 210 may include silicon oxide, silicon nitride, silicon oxynitride, a spin-on dielectric material, or a low-K dielectric material. It should be noted that the low-K dielectric materials are generally dielectric materials having a dielectric constant lower than 3.9. The insulating material 210 may be formed by high-density-plasma chemical vapor deposition (HDP-CVD), sub-atmospheric chemical vapor deposition (SACVD) or by spin-on processes.

Referring to FIG. 5, after forming the insulating material 210, etching processes are performed to remove a portion of the insulating material 210, the patterned mask layer 202b' and the patterned pad layer 202a' until the semiconductor fins 208 are exposed. In some embodiments, the insulating material 210 filled in the trenches 206 is partially removed by the etching process such that the insulators 210a are formed on the semiconductor substrate 200a. For example, each insulator 210a is located between two adjacent semiconductor fins 208. In one embodiment, the etching process may be a wet etching process with hydrofluoric acid (HF) or a dry etching process. In some embodiments, the top surfaces 201T of the insulators 210a are lower than the top surfaces 208T of the semiconductor fins 208. The semiconductor fins 208 protrude from the top surfaces 201T of the insulators 210a. The height difference between the top surfaces 208T of the semiconductor fins 208 and the top surfaces 201T of the insulators 210a ranges from about 15 nm to about 50 nm. In some embodiments, the protruded portions of the semiconductor fins 208 include a channel region 208A and source/drain regions 208B located aside the channel region 208A. In certain embodiments, the source/drain regions 208B of the semiconductor fins 208 are of substantially the same height as that of the channel region 208A of the fins 208.

Figure 6A:
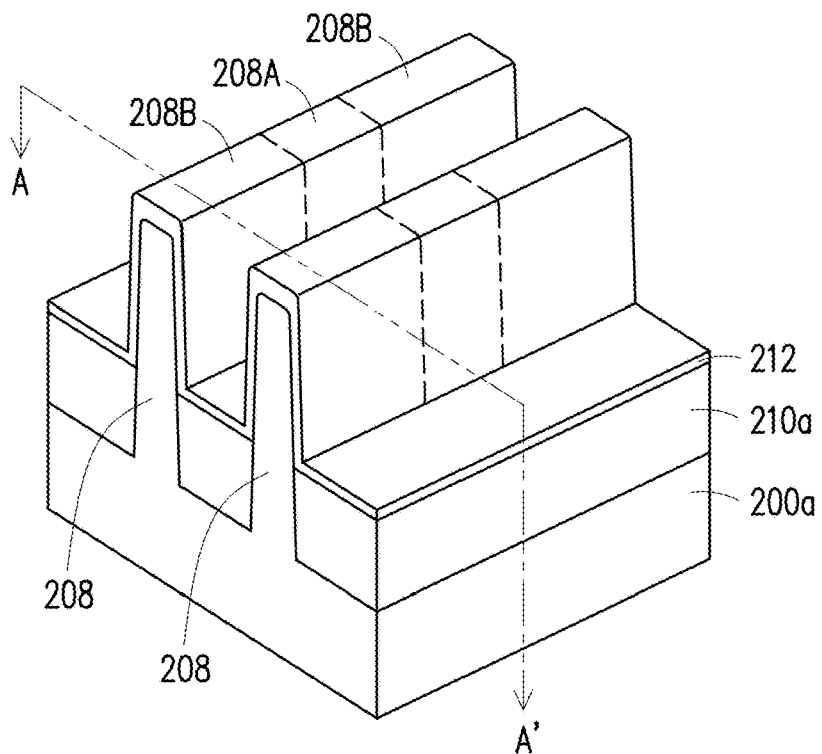
Figure 6B:
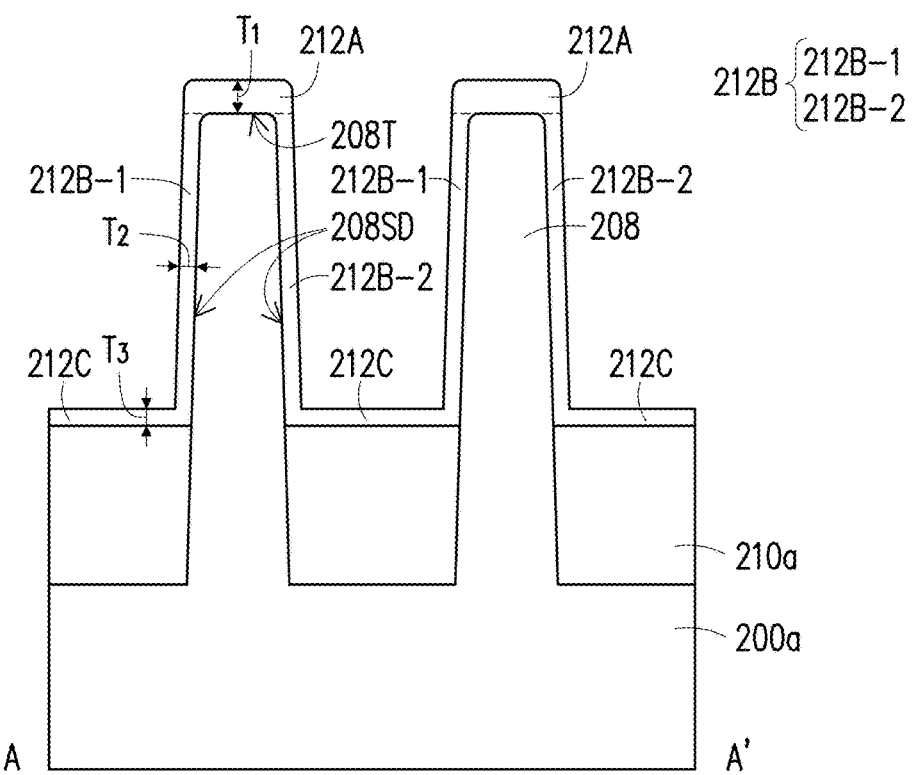

FIG. 6A is a perspective view of the semiconductor device at one of various stages of the manufacturing method. FIG. 6B is a sectional view illustrating the semiconductor device of FIG. 6A taken along the line A-A'. In step S14 in FIG. 1 and as shown in FIG. 6A and FIG. 6B, a liner structure 212 is formed on the plurality of insulators 210a and across the semiconductor fins 208. In the exemplary embodiment, the liner structure 212 includes a cap portion 212A, sidewall portions 212B and base portions 212C. The cap portion 212A is covering the top surfaces 208T of the semiconductor fins 208 and joined with the sidewall portions 212B. The sidewall portions 212B are covering sidewalls 208SD of the semiconductor fins 208. In some embodiments, the sidewall portions 212B may include a first sidewall portion 212B-1 and a second sidewall portion 212B-2 covering opposite sidewalls 208SD of a semiconductor fin 208. The cap portion 212A may be joining the first sidewall portion 212B-1 to the second sidewall portion 212B-2. Furthermore, the base portions 212C are covering the insulators 210a and joined with the sidewall portions 212B. For example, the base portions 212C may be joined with the first sidewall portion 212B-1 and/or the second sidewall portion 212B-2.

As illustrated in FIG. 6A and FIG. 6B, a maximum thickness of the cap portion 212A is $T_1$, a thickness of the sidewall portions 212B is $T_2$, and a thickness of the base portions 212C is $T_3$. In some embodiments, the maximum thickness $T_1$ of the cap portion 212A is greater than the thickness $T_2$ of the sidewall portions 212B. In some embodiments, the maximum thickness $T_1$ and the thickness $T_2$ satisfies the relationship: $0.08 \leq [(T_1-T_2)/T_2] \leq 0.26$. Furthermore, the thickness $T_3$ of the base portions 212C is substantially equal to the thickness $T_2$ of the sidewall portions 212B. In the exemplary embodiment, by controlling the thicknesses of the cap portion 212A, the sidewall portions 212B and the base portions 212C $T_1$, $T_2$ and $T_3$ in such a range, an issue of over-etching on the semiconductor fins 208 or the formation of pits on the semiconductor fins 208 may be prevented. In some embodiments, if $[(T_1-T_2)/T_2]$ is smaller than 0.08, then the impact on the formation of pits on the semiconductor fins 208 becomes worse. In some other embodiments, if $[(T_1-T_2)/T_2]$ is greater than 0.26, then it increases the manufacturing time during subsequent etching process, and increases the manufacturing cost.

In the exemplary embodiment, the liner structure 212 is formed by performing a deposition process and a plasma treatment process, for example. In some embodiments, the deposition process includes introducing a plurality of precursors over a surface of the plurality of insulators 210a and on the semiconductor fins 208 to form a liner layer (not shown). In certain embodiments, the deposition process is a plasma-enhanced atomic layer deposition (PEALD) process, and the plurality of precursors is silicon-containing precursors. In one embodiment, the silicon-containing precursors is SAM-24 ($H_2Si[N(C_2H_5)_2]_2$). Furthermore, in some embodiments, the plasma-enhanced atomic layer deposition process may be performed at a plasma power of 15 W to 800 W. In certain embodiments, the plasma-enhanced atomic layer deposition process may be performed at a plasma power of 500 W to 650 W to form the liner layer. The plasma-enhanced atomic layer deposition process is performed at a plasma power of 500 W to 650 W so that the liner layer having the desired thickness is ensured. In one embodiment, the plasma-enhanced atomic layer deposition process may be performed at a plasma power of 600 W.

Moreover, in some embodiments, the plasma treatment process includes treating the liner layer with a plasma selected from the group consisting of helium, argon, oxygen and hydrogen for 20 to 40 seconds under a source power of 500 W to 1500 W to form the liner structure 212. In some embodiments, the plasma treatment process includes a decoupled plasma oxidation process to form an oxide layer (e.g. such as silicon oxide) constituting the liner structure 212. In some embodiments, the plasma treatment process is performed to increase the thickness of the cap portion 212A of the liner structure 212. In other words, after the plasma treatment process, the liner structure 212 including the cap portion 212A, the sidewall portions 212B, and the base portions 212C may be formed.

Figure 7A:
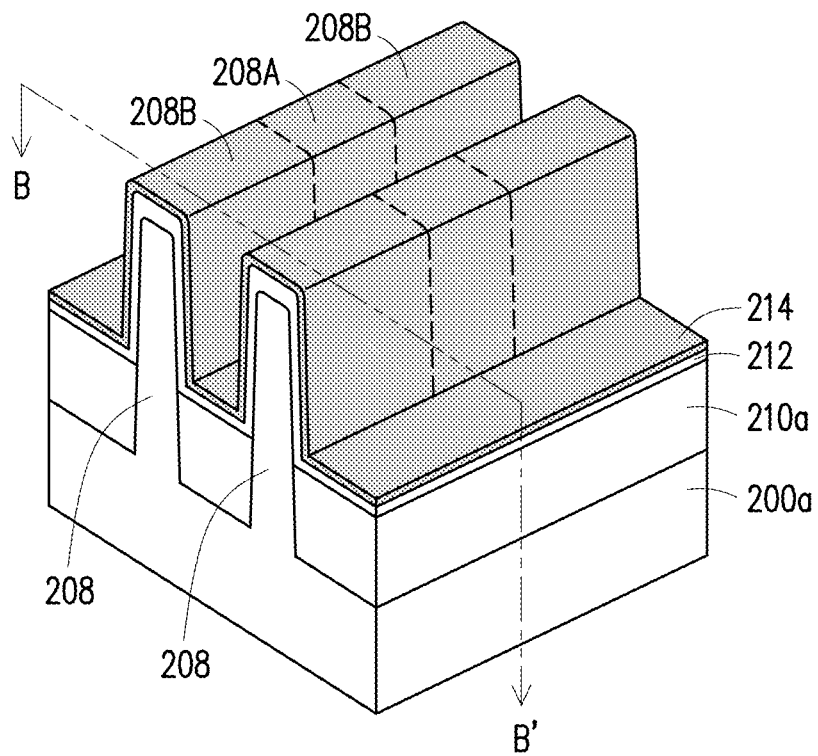
Figure 7B:
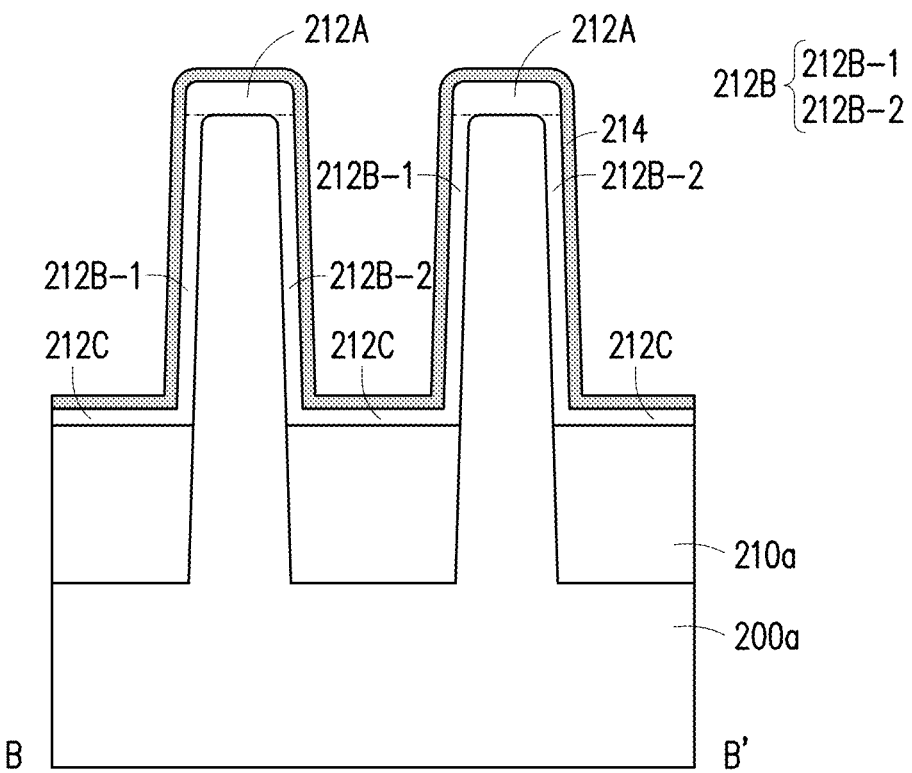

FIG. 7A is a perspective view of the semiconductor device at one of various stages of the manufacturing method. FIG. 7B is a sectional view illustrating the semiconductor device of FIG. 7A taken along the line B-B'. In step S16 in FIG. 1 and as shown in FIG. 7A and FIG. 7B, a dielectric layer 214 is conformally formed over the liner structure 212 and across the semiconductor fins 208. In some embodiments, a thickness of the dielectric layer 214 is maintained to be the same along the base portions 212C, the sidewall portions 212B and the cap portion 212A of the liner structure 212. In other words, a thickness of the dielectric layer 214 on the sidewall portions 212B is the same as a thickness of the dielectric layer 214 on the cap portion 212A. In certain embodiments, the dielectric layer 214 is formed to cover the channel region 208A and the source/drain regions 208B of the semiconductor fins 208. In some embodiments, the liner structure 212 is sandwiched in between the insulators 210a and the dielectric layer 214, or sandwiched in between the semiconductor fins 208 and the dielectric layer 214. In some embodiments, the material of the dielectric layer 214 may be silicon oxide, silicon nitride, silicon carbonitride or the like. In some embodiments, the method of forming the dielectric layer 214 may be an atomic layer deposition method. In some alternative embodiments, the formation of a dielectric layer 214 on the insulators 210a may be omitted.

Figure 8:
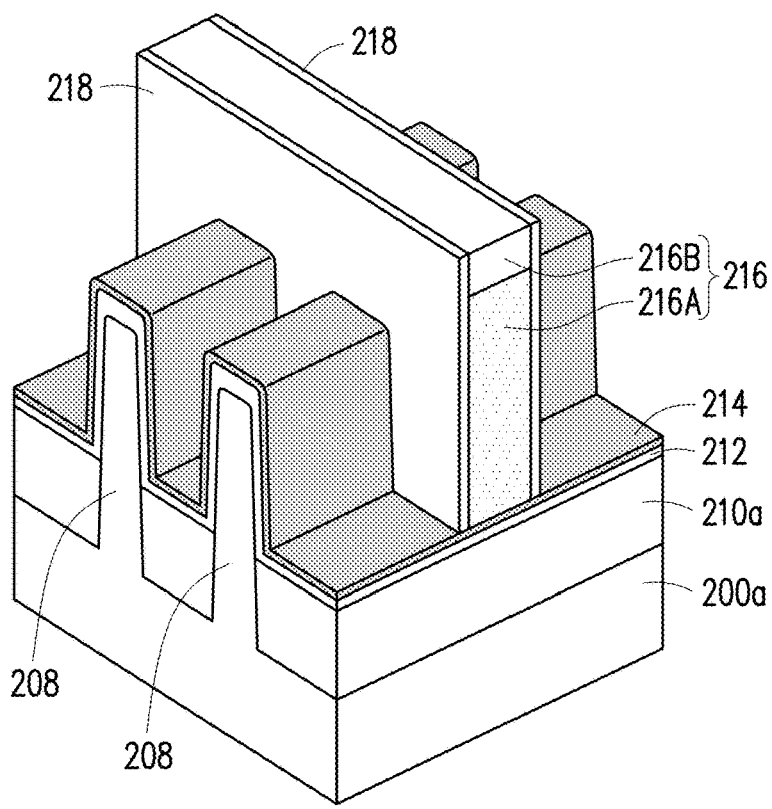

FIG. 8 is a perspective view of the semiconductor device at one of various stages of the manufacturing method. In step S18 in FIG. 1 and as shown in FIG. 8, a dummy gate stack 216 is formed on the dielectric layer 214 and across the semiconductor fins 208. The dummy gate stack 216 may include a polysilicon strip 216A and a hard mask strip 216B. In some embodiments, the dummy gate stack 216 is formed by forming a dummy layer (including a polysilicon layer and a hard mask layer) over the dielectric layer 214 and across the semiconductor fins 208, and patterning the dummy layer to form the polysilicon strip 216A and the hard mask strip 216B. In the exemplary embodiment, although one dummy gate stack 216 is illustrated herein, it should be noted that the number of dummy gate stack 216 is not limited to one and may be more than one. In some embodiments, the extension direction of the dummy gate stack 216 (the polysilicon strip 216A and the hard mask strip 216B) is arranged to be perpendicular to the extension direction of the semiconductor fins 208, and the dummy gate stack 216 is arranged across the semiconductor fins 208 and covers the channel region 208A of the semiconductor fins 208. In one embodiment, the material of the hard mask strip 216B includes silicon nitride, silicon oxide or the combination thereof.

Referring still to FIG. 8, after forming the dummy gate stack 216, spacer structures 218 are formed on two opposite sides of the dummy gate stack 216. In some embodiments, the spacer structures 218 are located on the dielectric layer 214 and are covering sidewalls of the polysilicon strip 216A and the hard mask strip 216B. In some embodiments, the spacer structures 218 may be formed by conformally forming a spacer material layer over the dielectric layer 214 and over the dummy gate stack 216, then performing an etching process on the spacer material layer to form the spacer structures 218. In some embodiments, the spacer material layer is formed of one or more dielectric materials, such as silicon nitride, silicon carbon oxynitride (SiCON), silicon carbonitride (SiCN) or combinations thereof. The spacer material layer may be a single layer or a multilayered structure. In some embodiments, the spacer material layer is formed by depositing a blanket layer of one or more dielectric materials. In one embodiment, the spacer material layer has a thickness ranging from 3 nm to 10 nm.

Figure 9A:
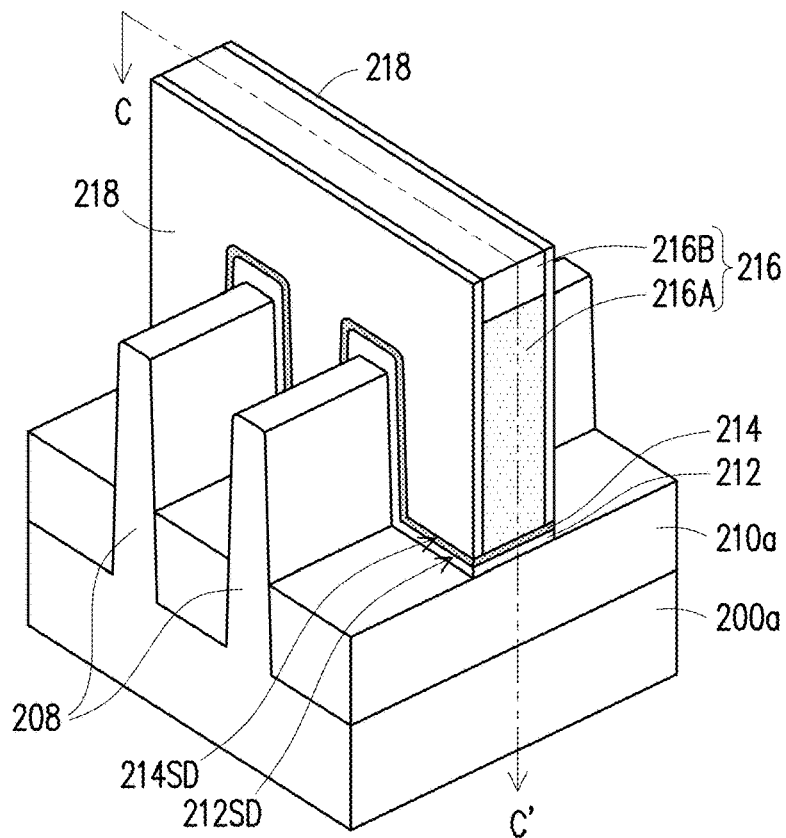
Figure 9B:
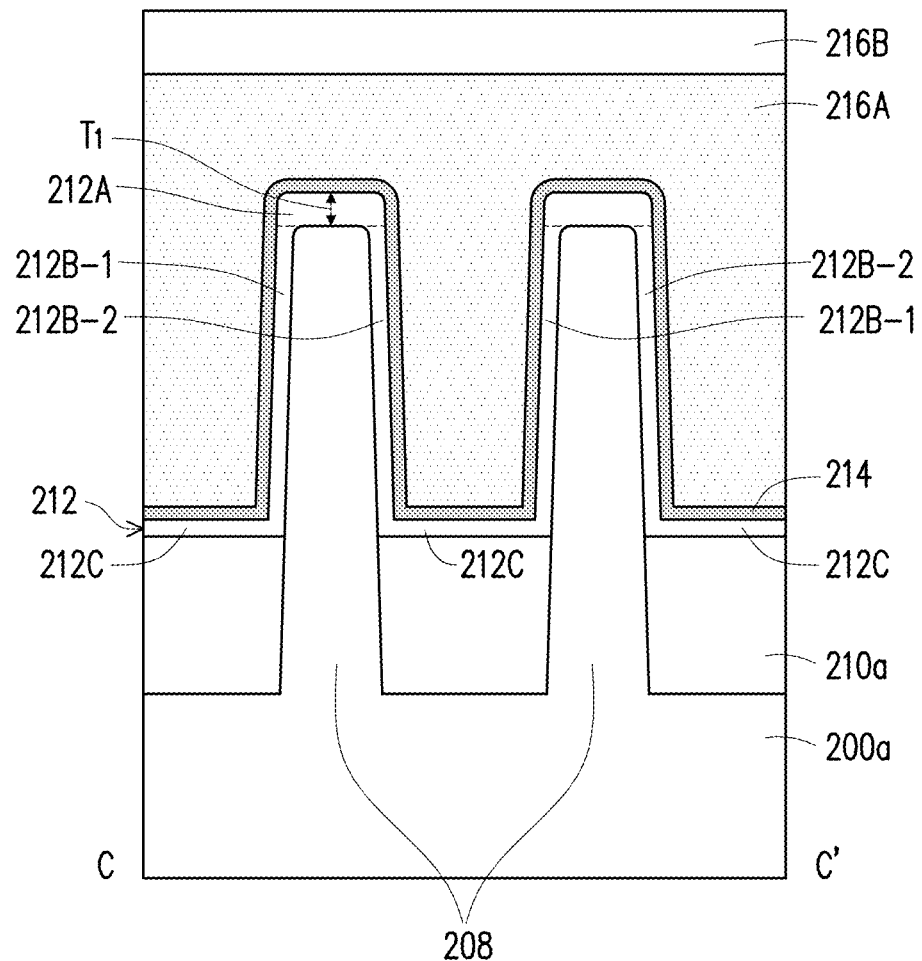

FIG. 9A is a perspective view of the semiconductor device at one of various stages of the manufacturing method. FIG. 9B is a sectional view illustrating the semiconductor device of FIG. 9A taken along the line C-C'. Referring to FIG. 9A and FIG. 9B, after forming the dummy gate stack 216 and the spacer structures 218, the dielectric layer 214 is patterned so that side surfaces 214SD of the dielectric layer 214 are aligned with side surfaces of the spacer structure 218. In some embodiments, portions of the dielectric layer 214 not covered by the dummy gate stack 216 and the spacer structures 218 are removed. In certain embodiments, the dielectric layer 214 may be patterned or removed by, for example, anisotropic etching, isotropic etching, and/or through atomic layer etching (ALE) processes.

Referring to FIG. 9A and FIG. 9B, on the channel region 208A (see FIG. 5) of the semiconductor fins 208, the liner structure 212 still includes the cap portion 212A, sidewall portions 212B and the base portions 212C, wherein the cap portion 212A has the greatest thickness $T_1$. In some embodiments, portions of the liner structure 212 located on the source/drain regions 208B (see FIG. 5) of the semiconductor fins 208 may be patterned and removed along with the dielectric layer 214. For example, after the patterning process, the cap portion 212A, the sidewall portions and the base portions 212C of the liner structure 212 located on the source/drain regions 208B are removed. In other words, the liner structure 212 on the source/drain regions 208B may be removed by selective etching processes to reveal the semiconductor fins 208. In certain embodiments, side surfaces 212SD of the liner structure 212 may be aligned with the side surfaces 214SD of the dielectric layer 214 after the patterning process.

Figure 10:
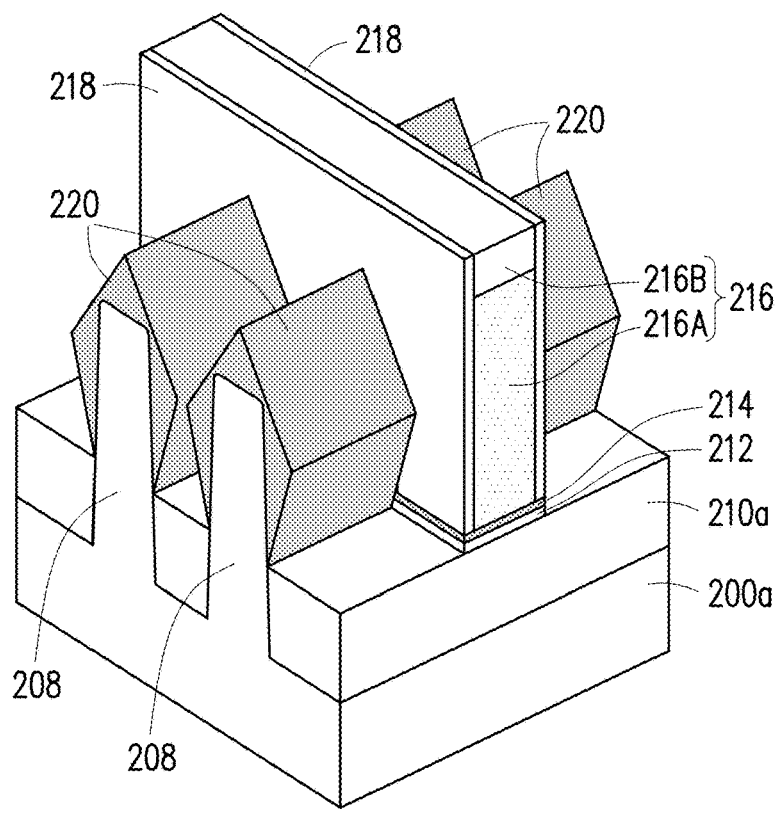

FIG. 10 is a perspective view of the semiconductor device at one of various stages of the manufacturing method. In step S20 in FIG. 1 and as shown in FIG. 10, strained material portions 220 may be formed on the source/drain regions 208B (see FIG. 5) of the semiconductor fins 208. In some embodiments, the strained material portions 220 are formed over portions of the semiconductor fins 208 that are revealed by the dummy gate stack 216. In some embodiments, the strained material portions 220 covers and contacts the semiconductor fins 208. In some embodiments, the strained material portions 220 are located on two opposite sides of the dummy gate stack 216.

In the exemplary embodiment, the strained material portions 220 (or a high doped low resistance material) is grown on the source/drain regions 208B of the semiconductor fins 208 to strain or stress the semiconductor fins 208. Thus, the strained material portions 220 comprises a source disposed at a side of the dummy stack gate 216 and a drain disposed at the other side of the dummy gate stack 216. The source covers an end of the semiconductor fins 208 and the drain covers the other end of the semiconductor fins 208. In some embodiments, the strained material portions 220 may be doped with a conductive dopant. In one embodiment, the strained material portions 220 include materials such as SiGe, and is epitaxial-grown with a p-type dopant for straining a p-type FinFET. That is, the strained material portions 220 is doped with the p-type dopant to be the source and the drain of the p-type FinFET. The p-type dopant comprises boron or BF2, and the strained material portions 220 may be epitaxial-grown by LPCVD process with in-situ doping. In another embodiment, the strained material portions 220 include materials such as SiC, SiP, a combination of SiC/SiP, or SiCP, and is epitaxial-grown with an n-type dopant for straining an n-type FinFET. That is, the strained material portions 220 is doped with the n-type dopant to be the source and the drain of the n-type FinFET. The n-type dopant comprises arsenic and/or phosphorus, and the strained material portions 220 may be epitaxial-grown by LPCVD process with in-situ doping. The strained material portions 220 may be a single layer or a multi-layer.

Figure 11:
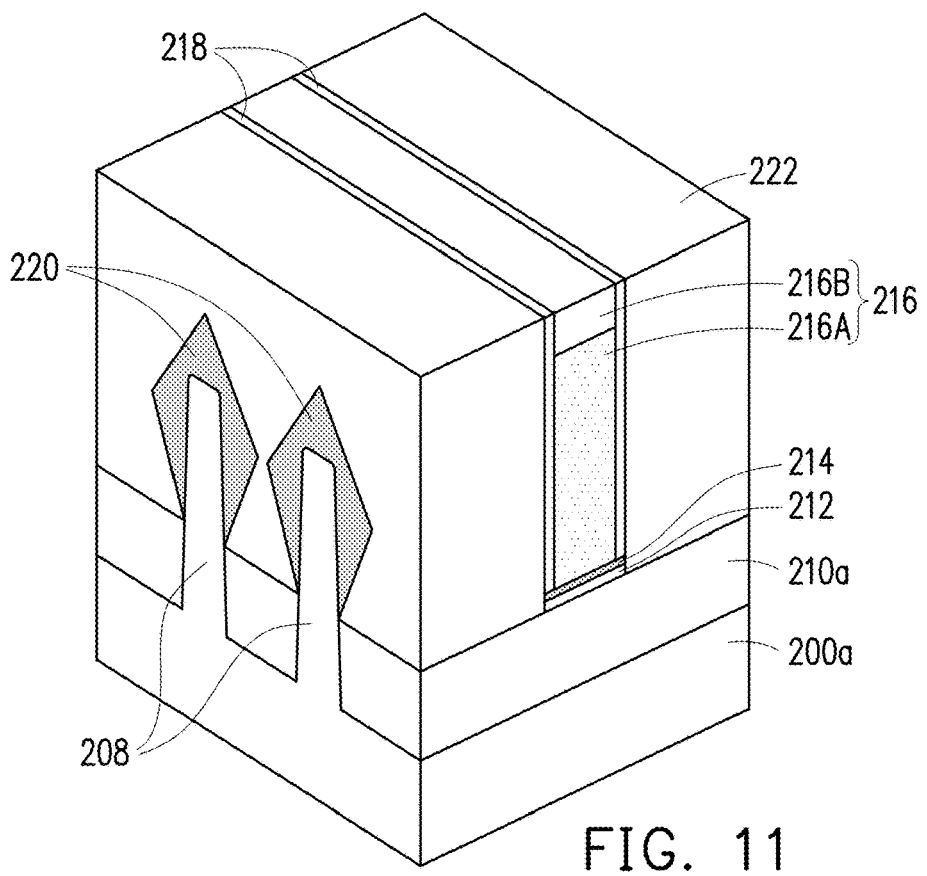

FIG. 11 is a perspective view of the semiconductor device at one of various stages of the manufacturing method. In step S22 in FIG. 1 and as shown in FIG. 11, an interlayer dielectric layer 222 is formed on the insulators 210a and covering the strained material portions 220. In some embodiments, the interlayer dielectric layer 222 is formed adjacent to the spacer structures 218. In some embodiments, the interlayer dielectric layer 222 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some other embodiments, the interlayer dielectric layer 222 includes low-K dielectric materials. Examples of low-K dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. It is understood that the interlayer dielectric layer 222 may include one or more dielectric materials and/or one or more dielectric layers.

In some embodiments, the interlayer dielectric layer 222 is formed to a suitable thickness by flowable CVD (FCVD), CVD, high density plasma CVD (HDPCVD), sub-atmospheric CVD (SACVD), spin-on, sputtering, or other suitable methods. Specifically, an interlayer dielectric material layer (not illustrated) is formed to cover the insulators 210a and the dummy gate stack 216 first. Subsequently, the thickness of the interlayer dielectric material layer is reduced until a top surface of the dummy gate stack 216 is exposed, so as to form the interlayer dielectric layer 222. The process of reducing the thickness of the interlayer dielectric material layer is achieved by a chemical mechanical polishing (CMP) process, an etching process, or other suitable process. The disclosure is not limited thereto.

Figure 12A:
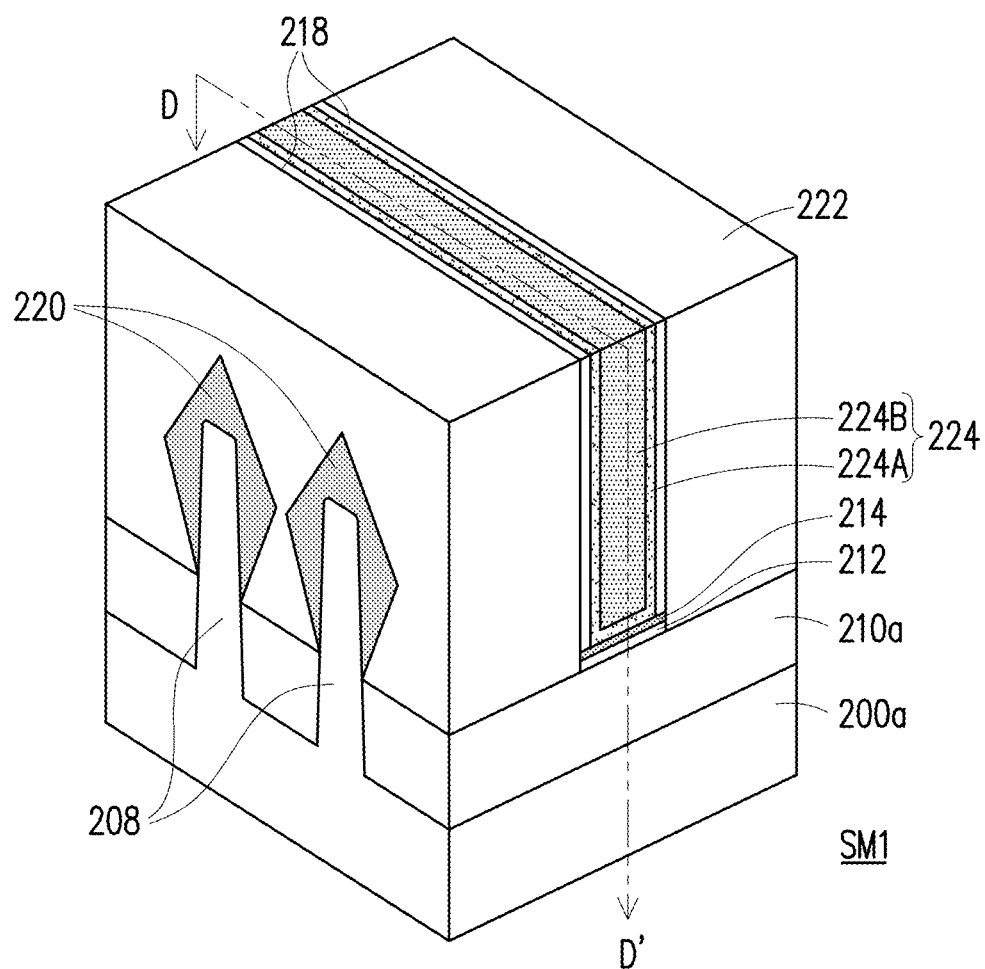
Figure 12B:
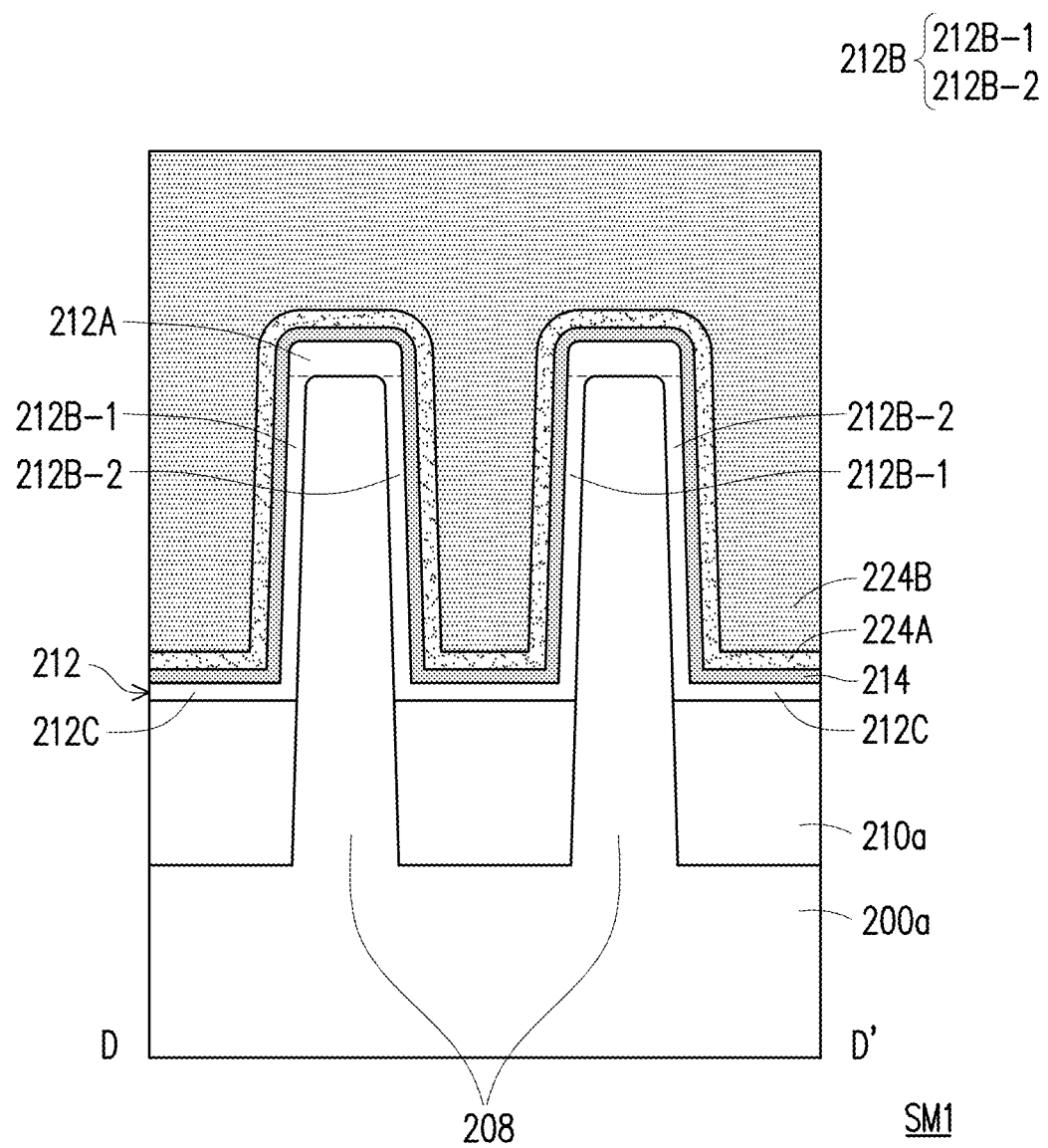

FIG. 12A is a perspective view of the semiconductor device at one of various stages of the manufacturing method. FIG. 12B is a sectional view illustrating the semiconductor device of FIG. 12A taken along the line D-D'. In step S24 in FIG. 1 and as shown in FIG. 12A and FIG. 12B, a gate stack 224 is formed by replacing the dummy gate stack 216 with the gate stack 224. In some embodiments, the polysilicon strip 216A and the hard mask strip 216B located on the channel region 208A of the semiconductor fins 208 are removed. In one embodiment, the polysilicon strips 216A and the hard mask strips 216B are removed by anisotropic etching, whereas the spacer structures 218, the liner structure 212 and the dielectric layer 214 are retained. After removing the dummy gate stack 216, a gate stack 224 is formed over the channel region 208A of the semiconductor fins 208, and over the liner structure 212 and on the dielectric layer 214.

As illustrated in FIG. 12A and FIG. 12B, the gate stack 224 includes a gate dielectric layer 224A and a gate electrode layer 224B, and the gate stack 224 is located in between the spacer structures 218. In an embodiment, the gate dielectric layer 224A is formed within the recesses between the spacer structures 218 and on the dielectric layer 214, and over the channel regions 208A of the semiconductor fins 208. In some embodiments, the gate dielectric layer 224A is conformally formed on the dielectric layer 214 and over the liner structure 212. In some embodiments, a thickness of the gate dielectric layer 224A is maintained to be the same along the base portions 212C, the sidewall portions 212B and the cap portion 212A of the liner structure 212.

In some embodiments, the material of the gate dielectric layer 224A includes silicon oxide, silicon nitride or the combination thereof. In some embodiments, the gate dielectric layer 224A includes a high-k dielectric material, and the high-k dielectric material has a k value greater than about 3.9 and includes a metal oxide or a silicate of Hf, Al, Zr, La, Mg, Ba, $T_1$, Pb and combinations thereof. In some embodiments, the gate dielectric layer 224A is formed by atomic layered deposition, molecular beam deposition (MBD), physical vapor deposition (PVD) or thermal oxidation. After forming the gate dielectric layer 224A, the gate electrode layer 224B is formed on the gate dielectric layer 224A, over the channel region 208A of the semiconductor fins 208 and fills the remaining recesses between the spacer structures 218. In certain embodiments, the gate dielectric layer 224A is formed in between the gate electrode layer 224B and the dielectric layer 214.

In some embodiments, the gate electrode layer 224B includes a metal-containing material, such as Al, Cu, W, Co, Ti, Ta, Ru, TiN, TiAl, TiAlN, TaN, TaC, NiSi, CoSi or a combination thereof. Depending on whether the semiconductor device is a p-type FinFET or an n-type FinFET, the materials of the gate dielectric layer 224A and/or the gate electrode layer 224B are appropriately chosen. Optionally, a chemical mechanical polishing (CMP) process is performed to remove the excess portions of gate dielectric layer 224A and the gate electrode layer 224B. The spacer structures 218 are located on sidewalls of the gate dielectric layer 224A and the gate electrode layer 224B. In other words, the dummy gate stack 216 is replaced, and the gate stack 224 is formed. In some embodiments described herein, the gate stack 216 is a replacement metal gate, but the structure(s) of the gate stack(s) or the fabrication processes thereof are not limited by these embodiments. Up to here, a semiconductor device SM1 according to some embodiments of the present disclosure is accomplished.

FIG. 13 to FIG. 16B are perspective and sectional views illustrating various stages of a method of fabricating semiconductor devices in accordance with some other embodiments of the disclosure. The embodiment shown in FIG. 13 to FIG. 16B is similar to the embodiment shown in FIG. 2 to FIG. 12B, hence the same reference numerals are used to refer to the same or like parts, and its detailed description will be omitted herein. The difference between the embodiments is that the dielectric layer 214 is omitted.

Figure 13:
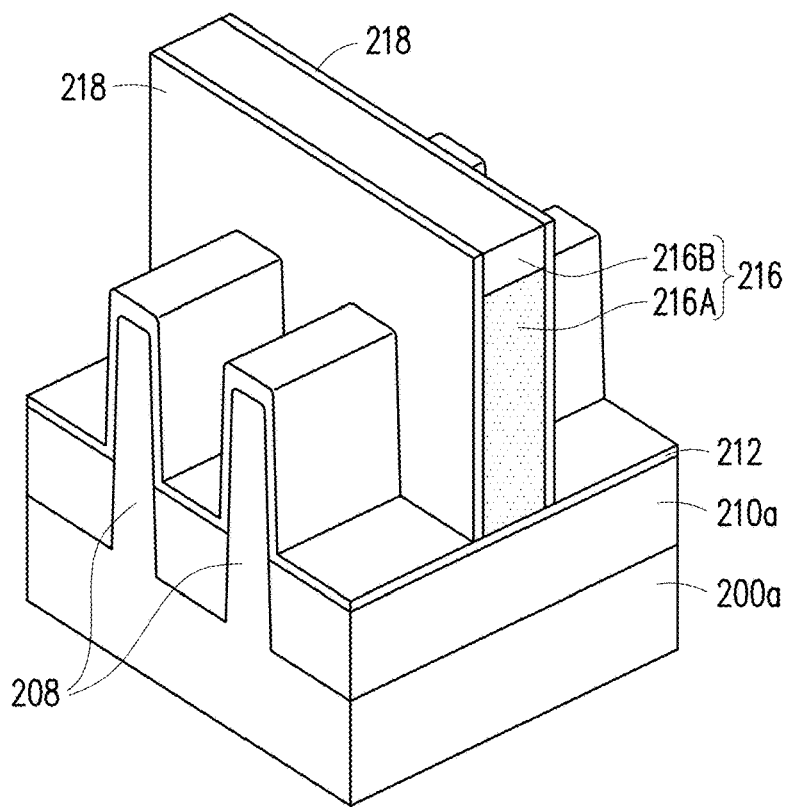
FIG. 13 to FIG. 16B are the perspective and cross-sectional views illustrating various stages of a method of fabricating semiconductor devices in accordance with some other embodiments of the disclosure.

In the exemplary embodiment, the same steps described in FIG. 2 to FIG. 6B may be performed to form the liner structure 212 over the insulators 210a and across the semiconductor fins 208. Referring to FIG. 13, after forming the liner structure 212, a dummy gate stack 216 is formed on the liner structure 212 and across the semiconductor fins 208. For example, the dummy gate stack 216 covers the channel region 208A of the semiconductor fins 208. Furthermore, spacer structures 218 are formed over the liner structure 212 on two opposite sides of the dummy gate stack 216.

Figure 14:
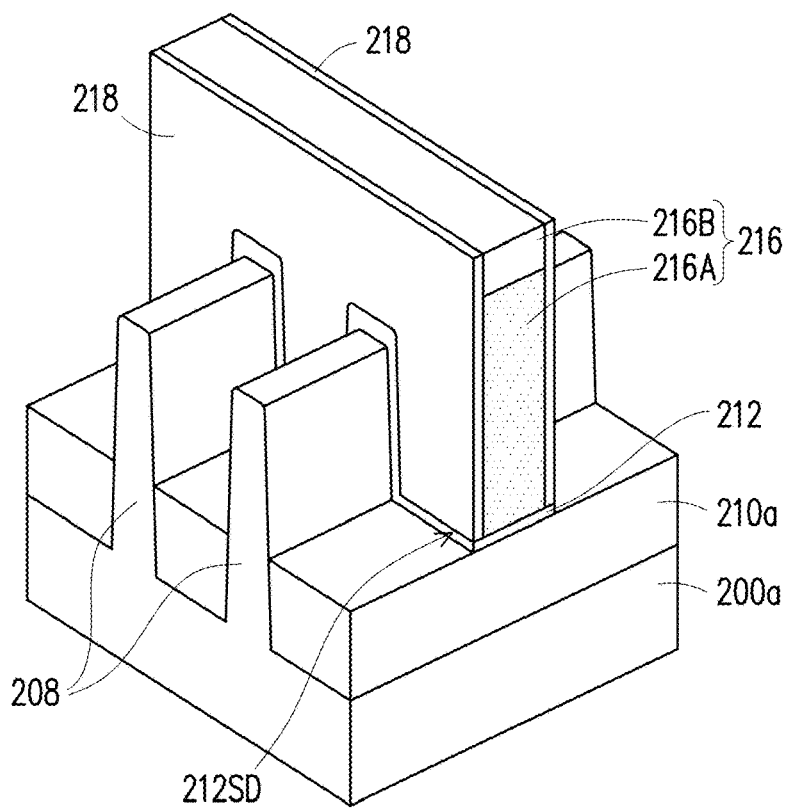

Referring to FIG. 14, in a next step, the liner structure 212 is patterned so that side surfaces 212SD of the liner structure 212 are aligned with side surfaces of the spacer structure 218. In some embodiments, portions of the liner structure 212 not covered by the dummy gate stack 216 and the spacer structures 218 are removed. In certain embodiments, the liner structure 212 may be patterned or removed by, for example, anisotropic etching, isotropic etching, and/or through atomic layer etching (ALE) processes.

Figure 15:
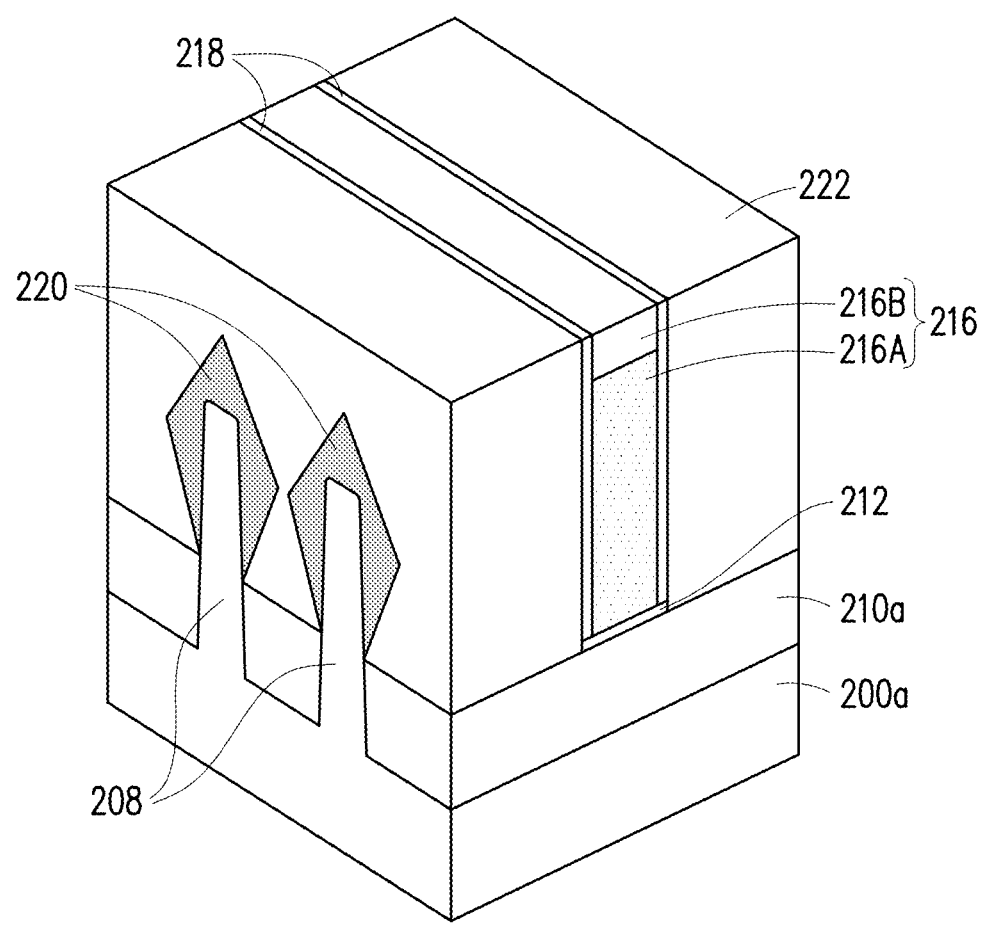

Referring to FIG. 15, the same steps may be performed to form strained material portions 220 on the source/drain regions 208B of the semiconductor fins 208, whereby the strained material portions 220 covers and contacts the semiconductor fins 208. Similarly, an interlayer dielectric layer 222 is formed on the insulators 210a and covering the strained material portions 220.

Figure 16A:
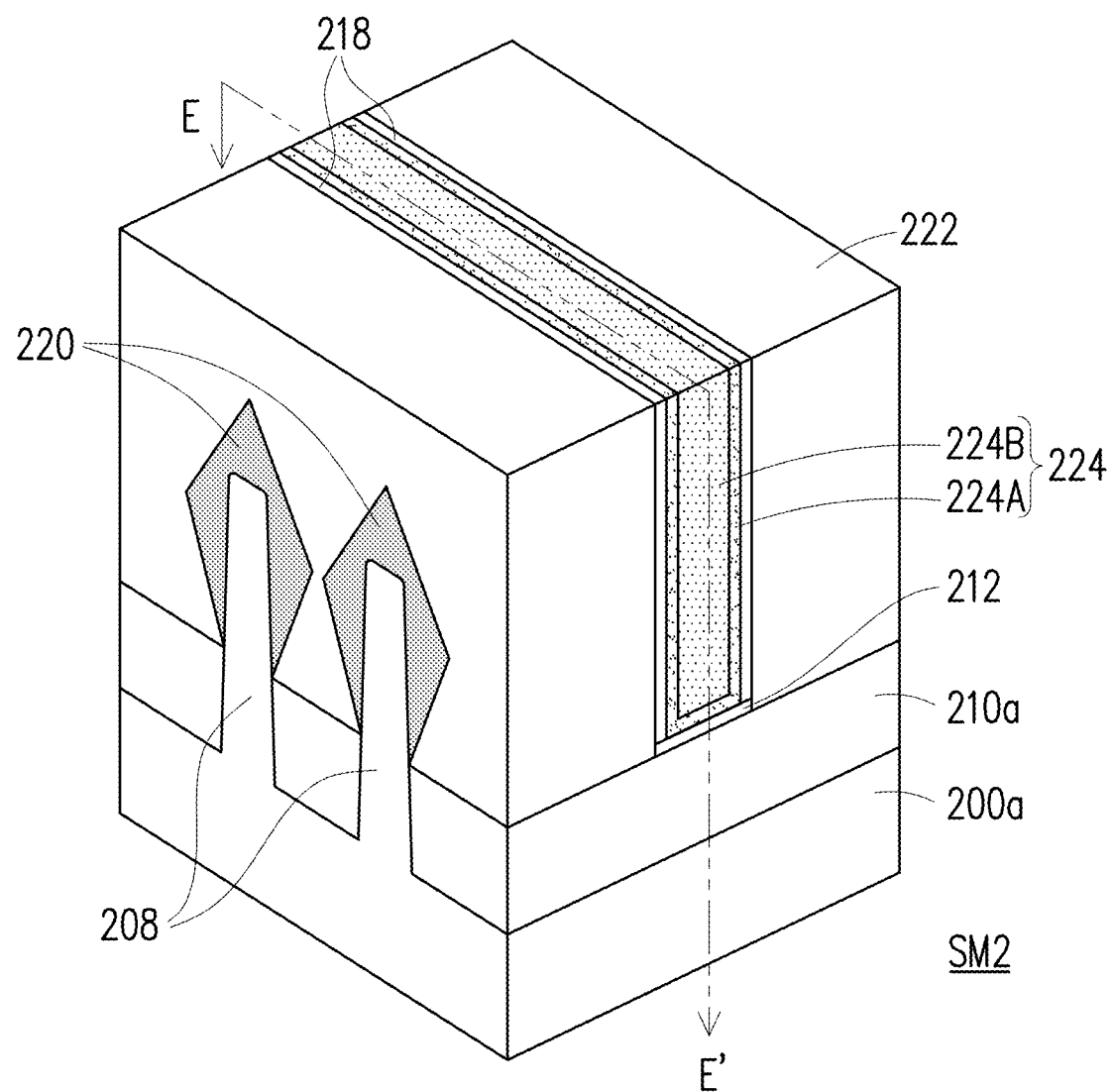
Figure 16B:
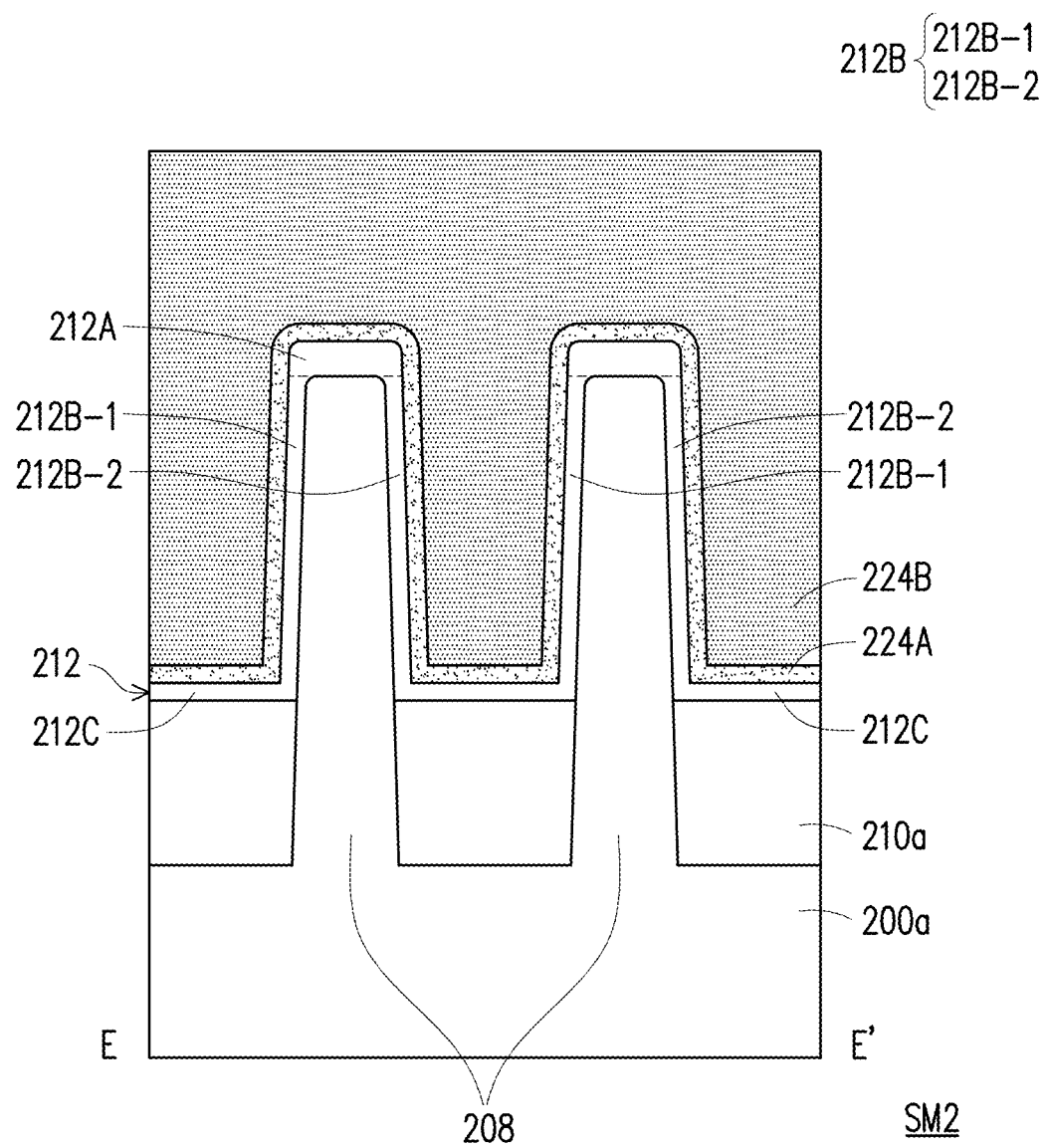

FIG. 16A is a perspective view of the semiconductor device at one of various stages of the manufacturing method. FIG. 16B is a sectional view illustrating the semiconductor device of FIG. 16A taken along the line E-E'. Referring to FIG. 16A and FIG. 16B, after forming the interlayer dielectric layer 222, the dummy gate stack 216 may be removed and replaced with gate stack 224. As such, a semiconductor device SM2 according to some other embodiments of the present disclosure is accomplished. Referring to FIG. 16A and FIG. 16B, on the channel region 208A (see FIG. 5) of the semiconductor fins 208, the liner structure 212 still includes the cap portion 212A, sidewall portions 212B and the base portions 212C. For example, the liner structure 212 is sandwiched in between the semiconductor fins 208 and the gate dielectric layer 224A.

FIG. 17 to FIG. 21B are the perspective and cross-sectional views illustrating various stages of a method of fabricating semiconductor devices in accordance with some other embodiments of the disclosure. The embodiment shown in FIG. 13 to FIG. 16 is similar to the embodiment shown in FIG. 2 to FIG. 12B, hence the same reference numerals are used to refer to the same or like parts, and its detailed description will be omitted herein. The difference between the embodiments is in the material of the semiconductor fins 208.

Figure 17:
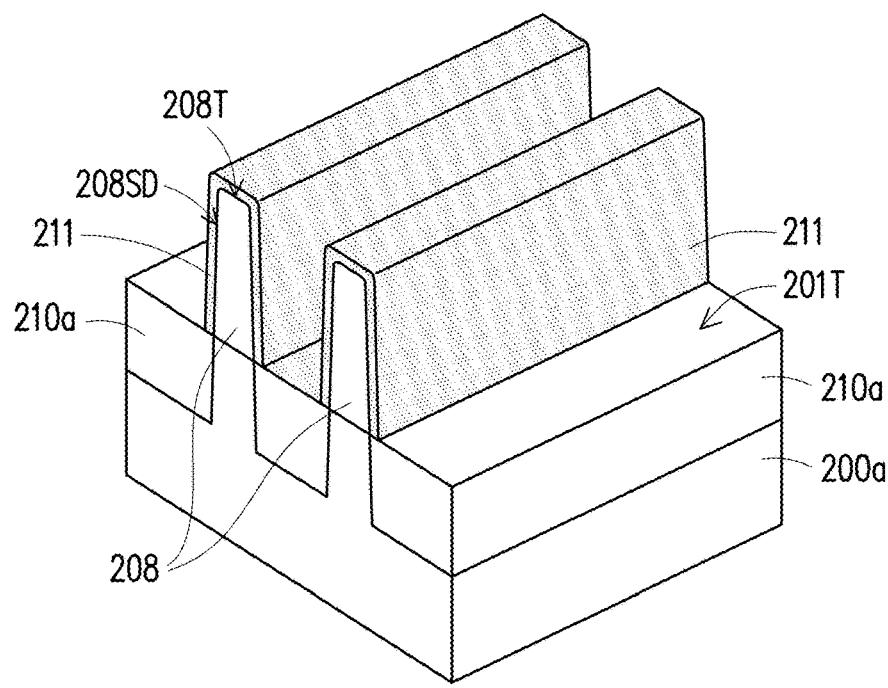
FIG. 17 to FIG. 21B are the perspective and cross-sectional views illustrating various stages of a method of fabricating semiconductor devices in accordance with some other embodiments of the disclosure.

Referring to FIG. 17, the same steps described in FIG. 2 to FIG. 5 may be performed to form the semiconductor fins 208, and insulators 210a in between the semiconductor fins 208. In the previous embodiments, the semiconductor fins 208 may be silicon fins, for example. However, the disclosure is not limited thereto, and in FIG. 17 to FIG. 21B, the semiconductor fins 208 are silicon-germanium (SiGe) fins, for example. In the exemplary embodiment, when the semiconductor fins 208 are silicon germanium fins, an additional capping layer 211 may be formed to cover the semiconductor fins 208. In some embodiments, the capping layer 211 may be a silicon capping layer. In some embodiments, the capping layer 211 is formed over the semiconductor fins 208 by low-pressure chemical vapor deposition (LPCVD) or plasma enhanced chemical vapor deposition (PECVD). For example, the capping layer 211 covers the top surfaces 208T and sidewalls 208SD of the semiconductor fins 208. In some embodiments, the capping layer 211 (silicon capping layer) is used to prevent the oxidation on the semiconductor fins 208 during the formation of the liner structure 212 performed in a subsequent step. In certain embodiments, the capping layer 211 prevents the formation of silicon germanium oxide (SiGeOx), which may affect the mobility of the semiconductor device.

Figure 18:
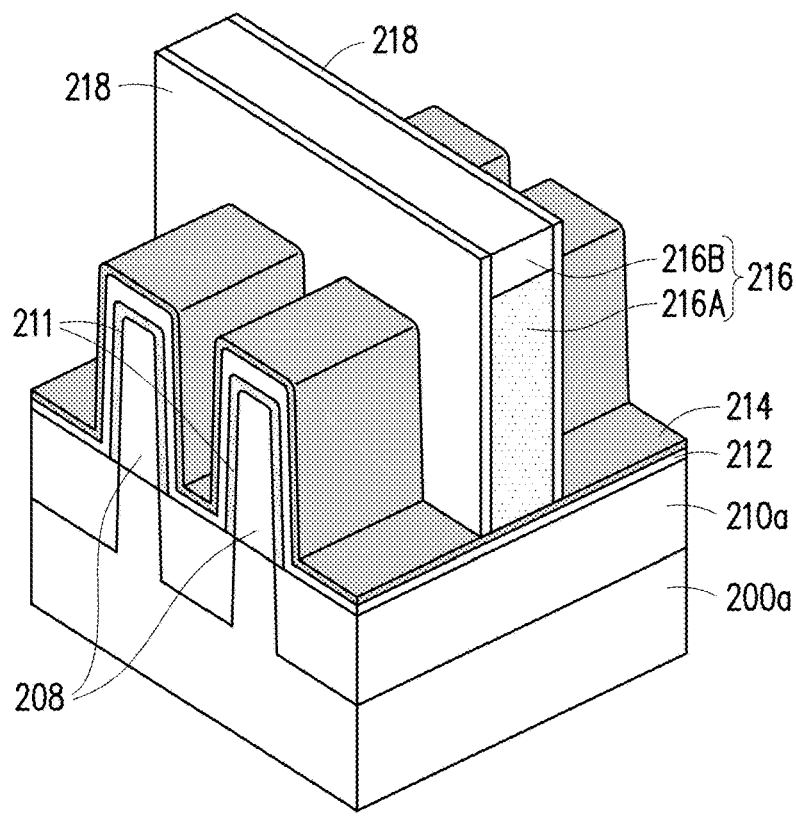

Referring to FIG. 18, after forming the capping layer 211, the same steps described in FIG. 6A to FIG. 8 may be performed to form the liner structure 212 over the capping layer 211, and to form the dielectric layer 214 over the liner structure 212. Thereafter, a dummy gate stack 216 and spacer structures 218 are formed on the dielectric layer 214, whereby the dummy gate stack 216 is located in between the spacer structures 218.

Figure 19A:
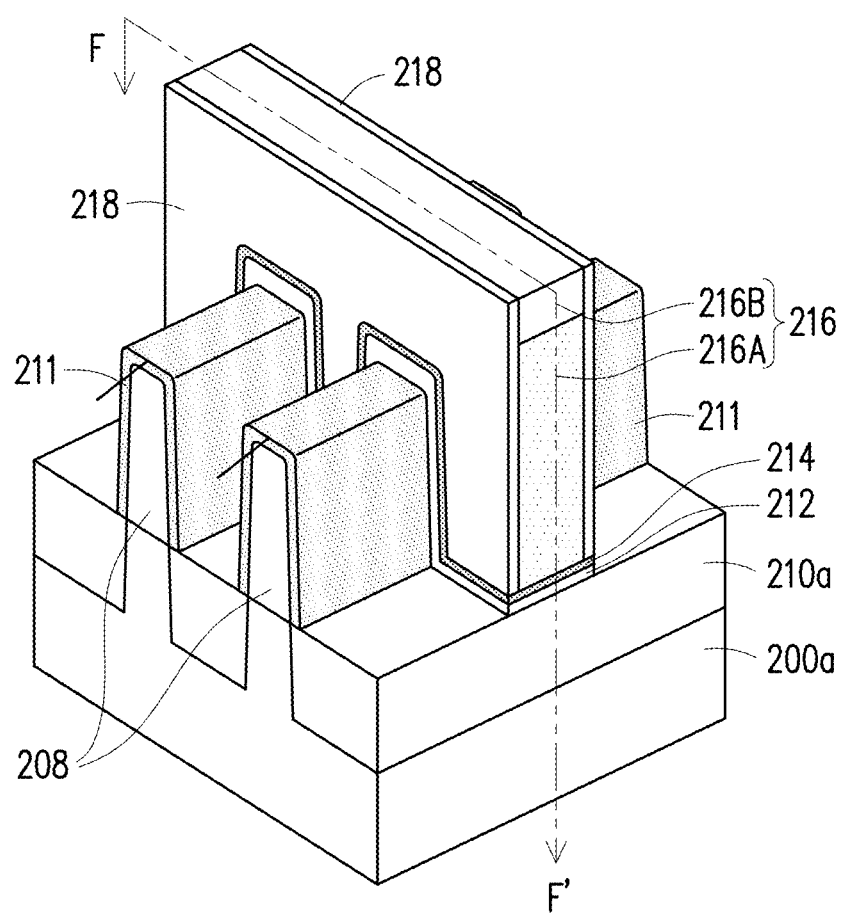
Figure 19B:
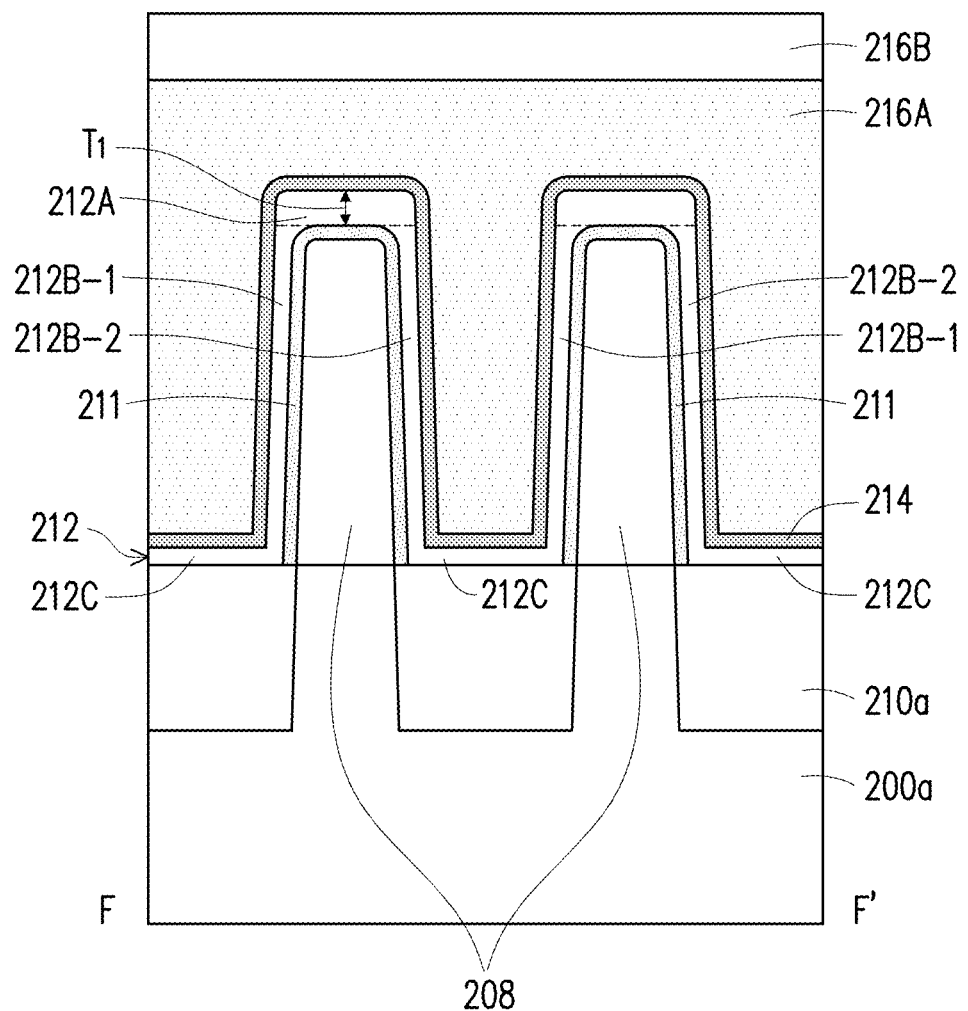

FIG. 19A is a perspective view of the semiconductor device at one of various stages of the manufacturing method. FIG. 19B is a sectional view illustrating the semiconductor device of FIG. 19A taken along the line F-F'. Referring to FIG. 19A and FIG. 19B, after forming the dummy gate stack 216 and the spacer structures 218, the dielectric layer 214 is patterned so that side surfaces 214SD of the dielectric layer 214 are aligned with side surfaces of the spacer structure 218. Similarly, portions of the liner structure 212 located on the source/drain regions 208B (see FIG. 5) of the semiconductor fins 208 may be patterned and removed along with the dielectric layer 214.

Referring to FIG. 19A and FIG. 19B, on the channel region 208A (see FIG. 5) of the semiconductor fins 208, the liner structure 212 still includes the cap portion 212A, sidewall portions 212B and the base portions 212C. Furthermore, in some embodiments, the capping layer 211 may be retained on the source/drain regions 208B (see FIG. 5) of the semiconductor fins 208. However, the disclosure is not limited thereto. For example, in some alternative embodiments, the capping layer 211 on the source/drain regions 208B may be removed to reveal the semiconductor fins 208 before forming the strained material portions 220. As illustrated in FIG. 19A and FIG. 19B, in some embodiments, the capping layer 211 is sandwiched in between the liner structure 212 and the channel region 208A of the semiconductor fins 208. In certain embodiments, the liner structure 212 is sandwiched in between the capping layer 211 and the dielectric layer 214.

Figure 20:
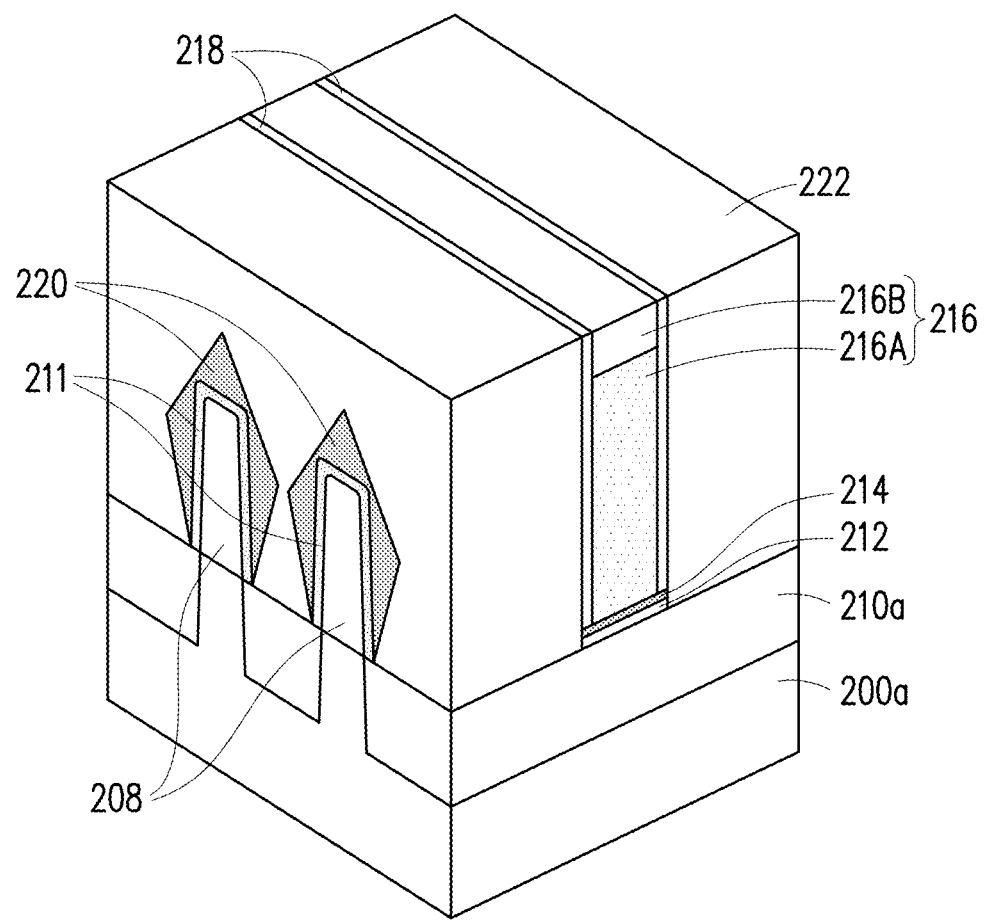

Referring to FIG. 20, the same steps may be performed to form strained material portions 220 on the source/drain regions 208B of the semiconductor fins 208, whereby the strained material portions 220 covers and contacts the capping layer 211 (silicon capping layer). Similarly, an interlayer dielectric layer 222 is formed on the insulators 210a and covering the strained material portions 220.

Figure 21A:
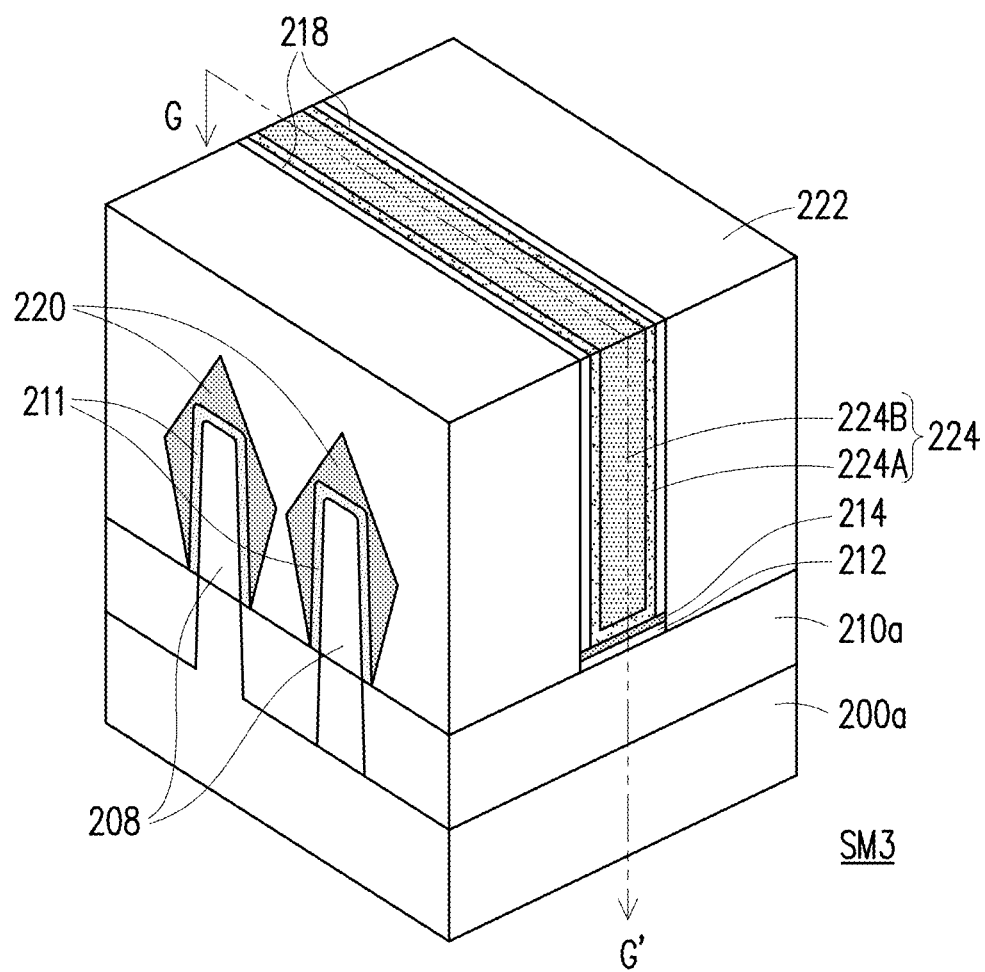
Figure 21B:
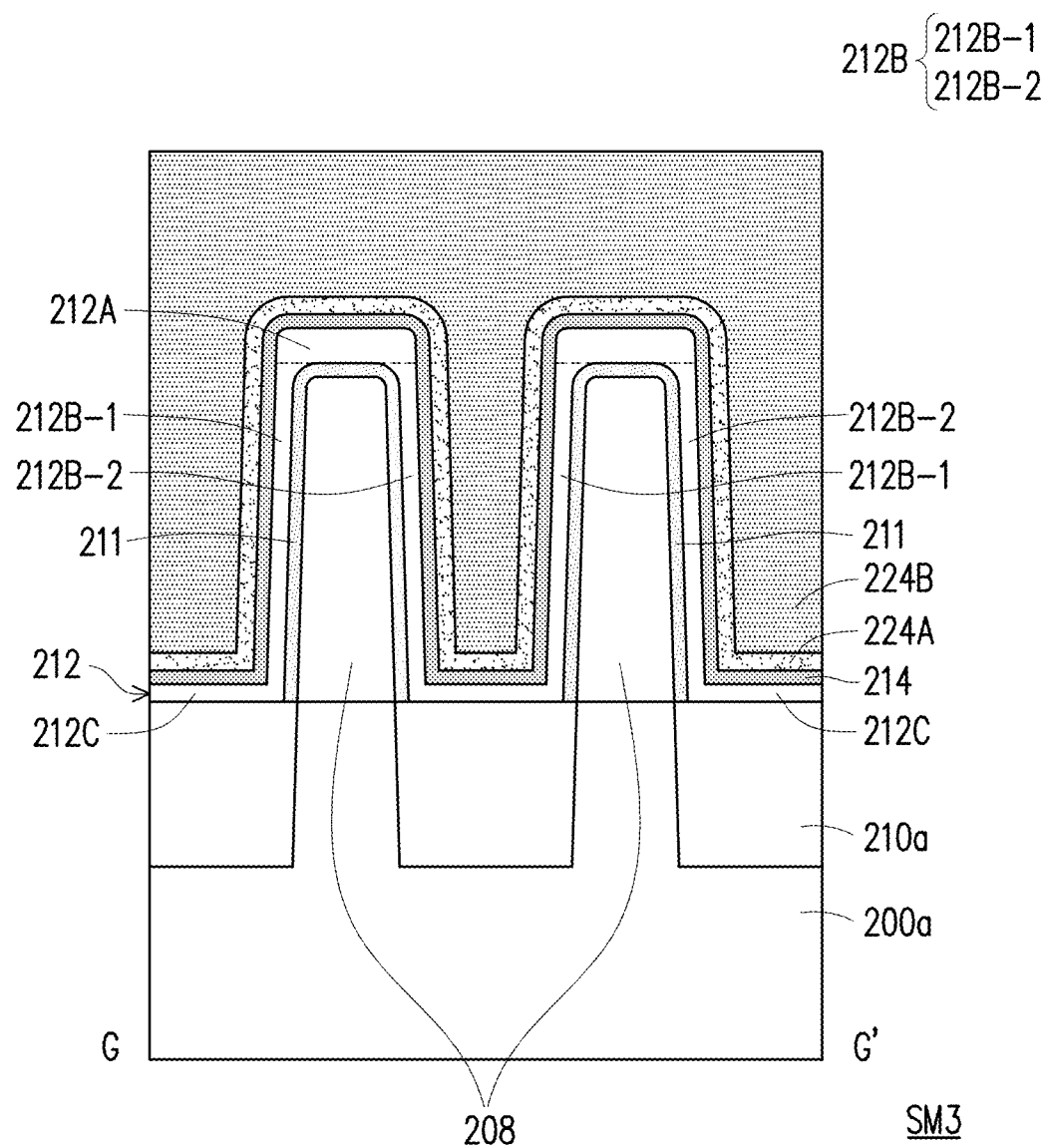

FIG. 21A is a perspective view of the semiconductor device at one of various stages of the manufacturing method. FIG. 21B is a sectional view illustrating the semiconductor device of FIG.21A taken along the line G-G'. Referring to FIG. 21A and FIG. 21B, after forming the interlayer dielectric layer 222, the dummy gate stack 216 may be removed and replaced with gate stack 224. As such, a semiconductor device SM3 according to some other embodiments of the present disclosure is accomplished. Referring to FIG. 21A and FIG. 21B, on the channel region 208A (see FIG. 5) of the semiconductor fins 208, the liner structure 212 still includes the cap portion 212A, sidewall portions 212B and the base portions 212C. For example, the liner structure 212 is located in between the capping layer 211 and the gate stack 224. In certain embodiments, the liner structure 212 is sandwiched in between the capping layer 211 and the dielectric layer 214.

FIG. 22 to FIG. 25 are the perspective views illustrating various stages of a method of fabricating semiconductor devices in accordance with some other embodiments of the disclosure. The embodiment shown in FIG. 22 to FIG. 25 is similar to the embodiment shown in FIG. 2 to FIG. 12B, hence the same reference numerals are used to refer to the same or like parts, and its detailed description will be omitted herein. The difference between the embodiments is in the way of patterning the liner structure 212.

Figure 22:
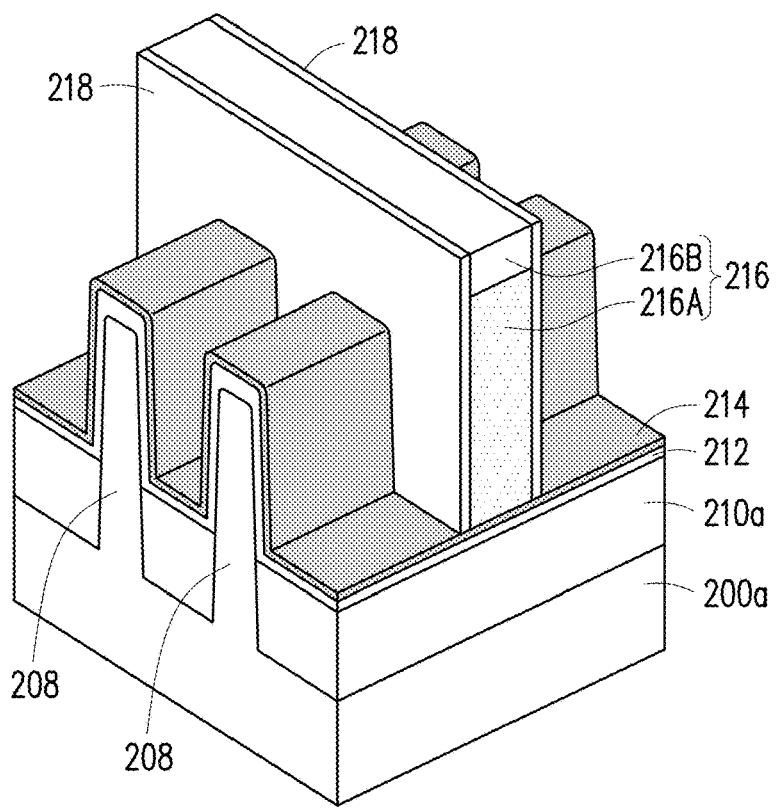
FIG. 22 to FIG. 25 are the perspective views illustrating various stages of a method of fabricating semiconductor devices in accordance with some other embodiments of the disclosure.
Figure 23:
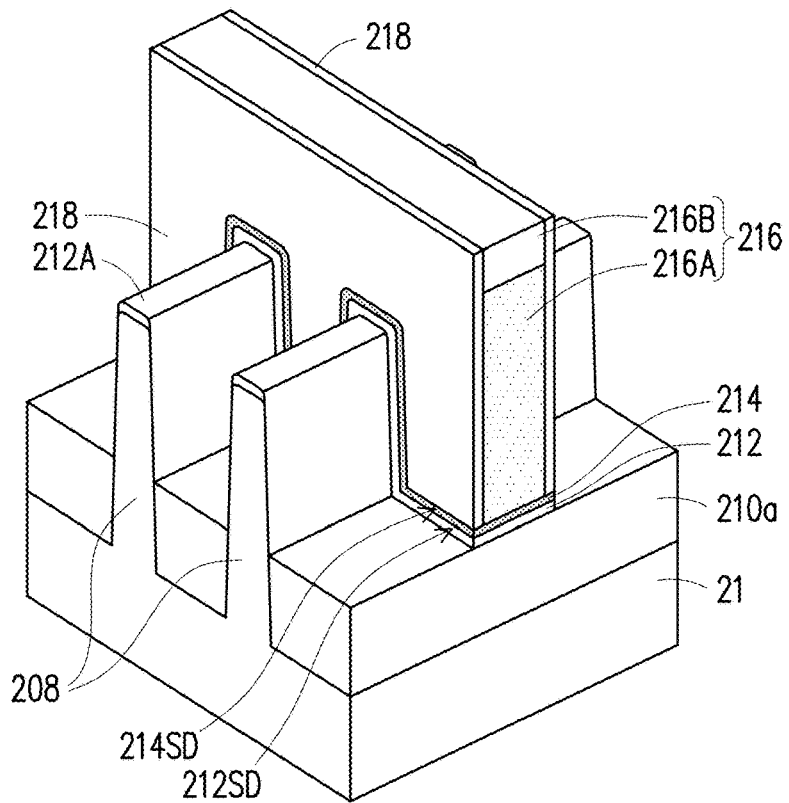
Figure 24:
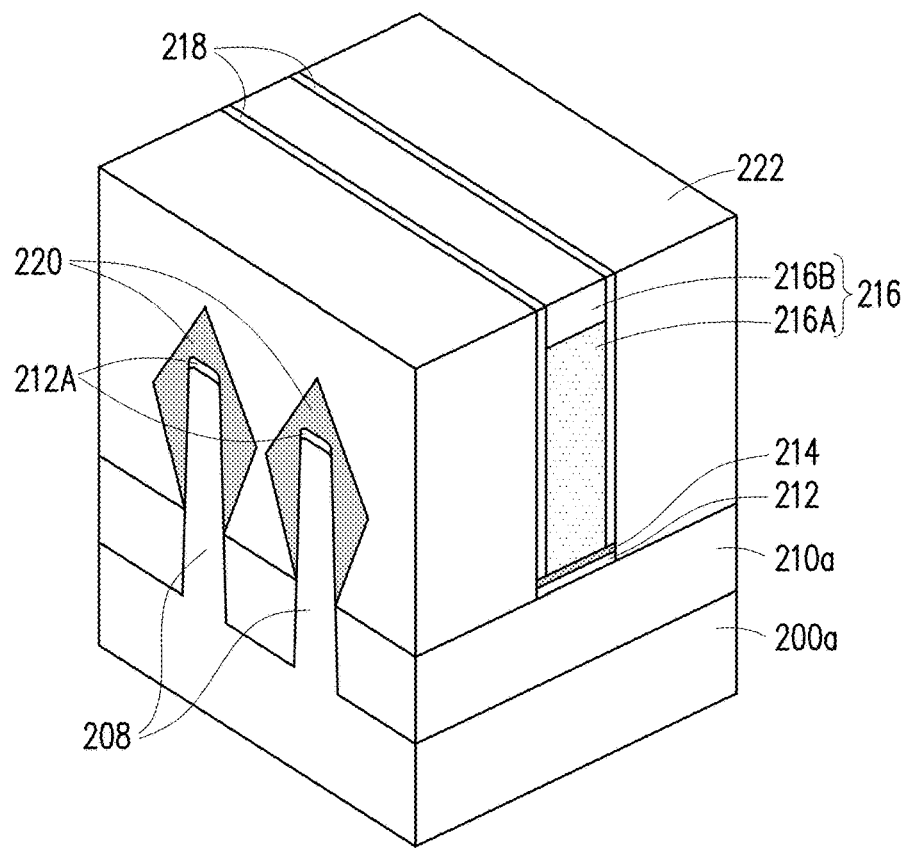

FIG. 22 is a stage of manufacturing a semiconductor device similar to that described in FIG. 8, whereby a dummy gate stack 216 and spacer structures 218 are formed on the dielectric layer 214. Referring to FIG. 23, after forming the dummy gate stack 216 and the spacer structures 218, the dielectric layer 214 is patterned so that side surfaces 214SD of the dielectric layer 214 are aligned with side surfaces of the spacer structure 218. In some embodiments, portions of the liner structure 212 located on the source/drain regions 208B (see FIG. 5) of the semiconductor fins 208 may be patterned and removed along with the dielectric layer 214. For example, after the patterning process, the liner structure 212 includes the cap portion 212A located on the source/drain regions 208B of the semiconductor fins 208, whereas the sidewall portions and the base portions 212C are removed. In certain embodiments, sidewalls of the fins 208 are also revealed after the patterning process. In some embodiments, through the patterning or etching processes, a thickness of the cap portion 212A on the source/drain regions 208B is also reduced. In the exemplary embodiment, since the cap portion 212A initially has a thickness greater than that of the sidewall portions 212B and the base portions 212C, the cap portion 212A may be retained on the semiconductor fins 208 after the patterning/etching processes.

Figure 25:
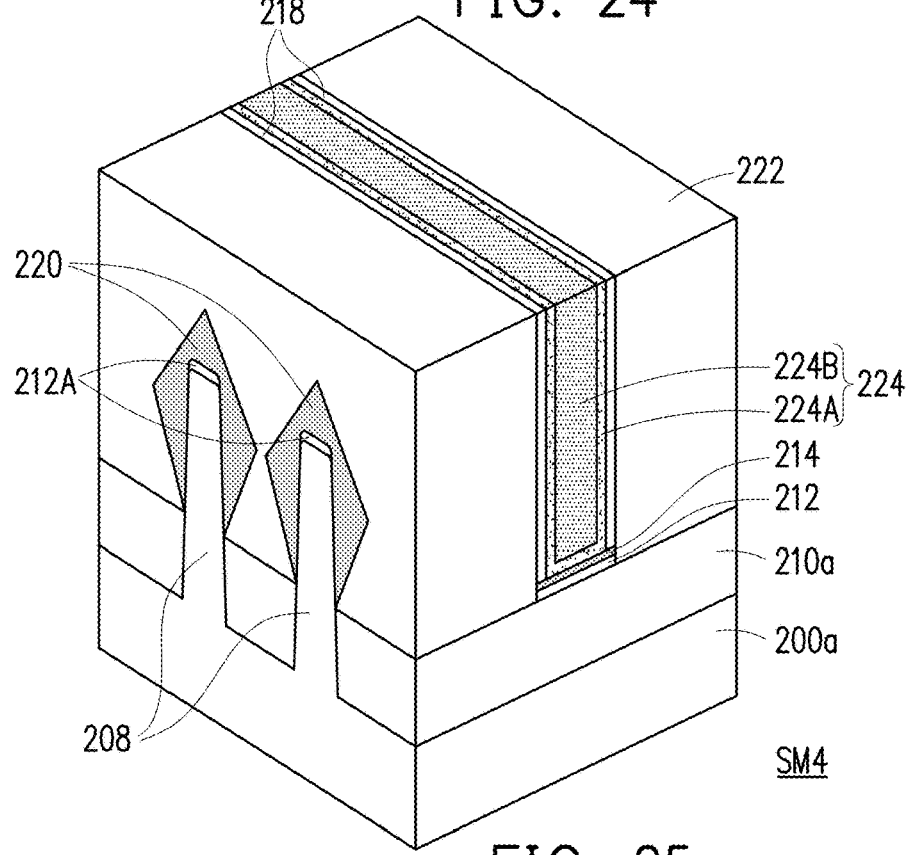

Referring to FIG. 23, the same steps may be performed to form strained material portions 220 on the source/drain regions 208B of the semiconductor fins 208, whereby the cap portion 212A may be covered by the strained material portions 220. In certain embodiments, the cap portion 212A of the liner structure 212 is disposed over the source/drain regions 208B of the semiconductor fins 208 and sandwiched in between the strained material portions 220 and the semiconductor fin 208. Similarly, an interlayer dielectric layer 222 is formed on the insulators 210a and covering the strained material portions 220. Referring to FIG. 25, after forming the interlayer dielectric layer 222, the dummy gate stack 216 may be removed and replaced with gate stack 224. As such, a semiconductor device SM4 according to some other embodiments of the present disclosure is accomplished.

FIG. 26 to FIG. 29 are the perspective and cross-sectional views illustrating various stages of a method of fabricating semiconductor devices in accordance with some other embodiments of the disclosure. The embodiment shown in FIG. 26 to FIG. 29 is similar to the embodiment shown in FIG. 2 to FIG. 12B, hence the same reference numerals are used to refer to the same or like parts, and its detailed description will be omitted herein. The difference between the embodiments is in the design of the semiconductor fins 208.

Figure 26:
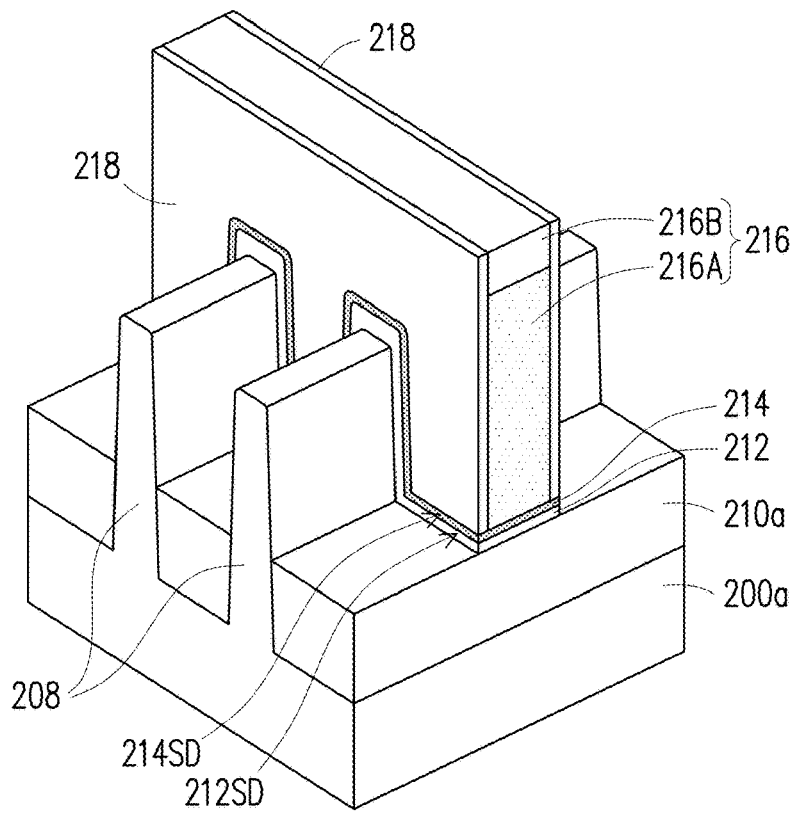
FIG. 26 to FIG. 29 are the perspective and cross-sectional views illustrating various stages of a method of fabricating semiconductor devices in accordance with some other embodiments of the disclosure.
Figure 27:
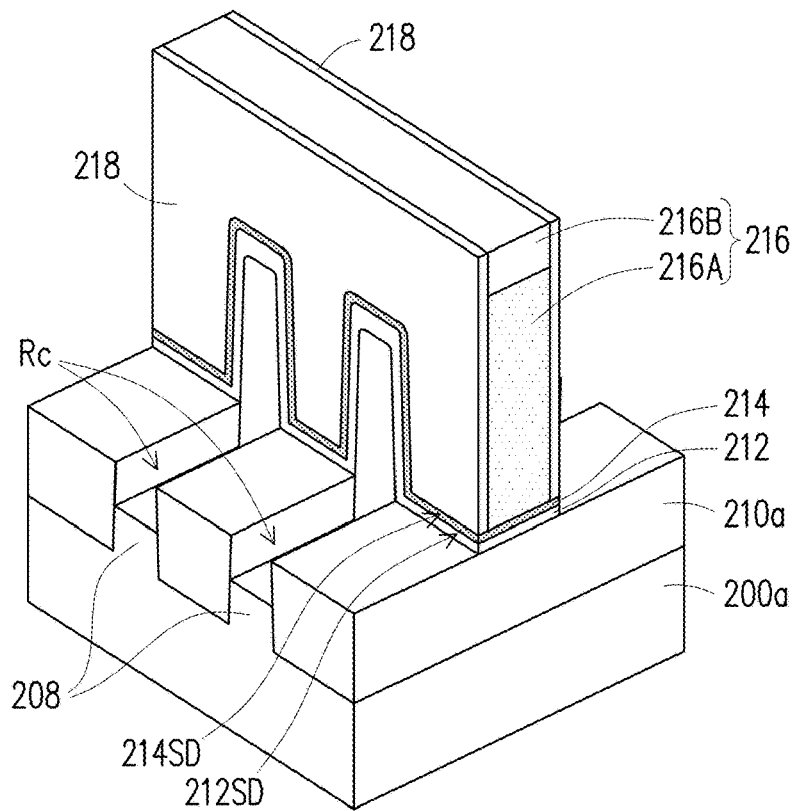

FIG. 26 is a stage of manufacturing a semiconductor device similar to that described in FIG. 9A, whereby the liner structure 212 and the dielectric layer 214 are pattered so that their side surfaces (212SD/214SD) may be aligned with side surfaces of the spacer structure 218. Referring to FIG. 27, after patterning the liner structure 212 and the dielectric layer 214, the semiconductor fins 208 exposed by the dummy gate stack 216 and the spacer structures 218 are removed/recessed to form a plurality of recessed portions Rc. For example, portions of the semiconductor fins 208 may be removed by, anisotropic etching, isotropic etching, or a combination thereof. In some embodiments, portions of the semiconductor fins 208 are recessed below the top surfaces of the insulators 210a. In some embodiments, a depth of the recessed portions Rc is less than a thickness of the insulators 210a. In other words, the semiconductor fins 208 exposed by the dummy gate stack 216 and the spacer structures 218 are not entirely removed, and the remaining semiconductor fins 208 located in the recessed portion Rc form the source/drain regions of the semiconductor fins 208.

Figure 28:
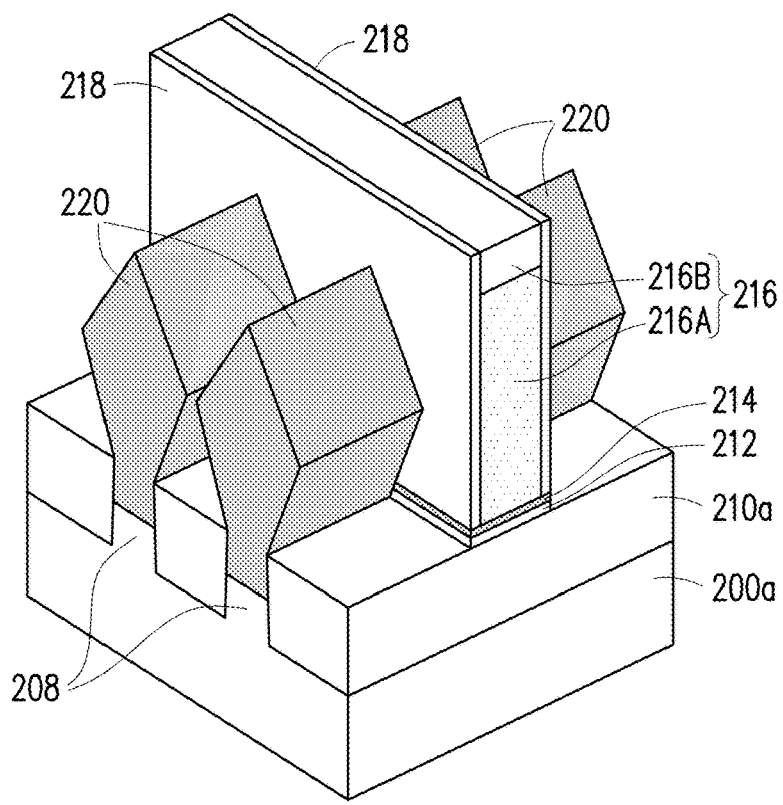
Figure 29:
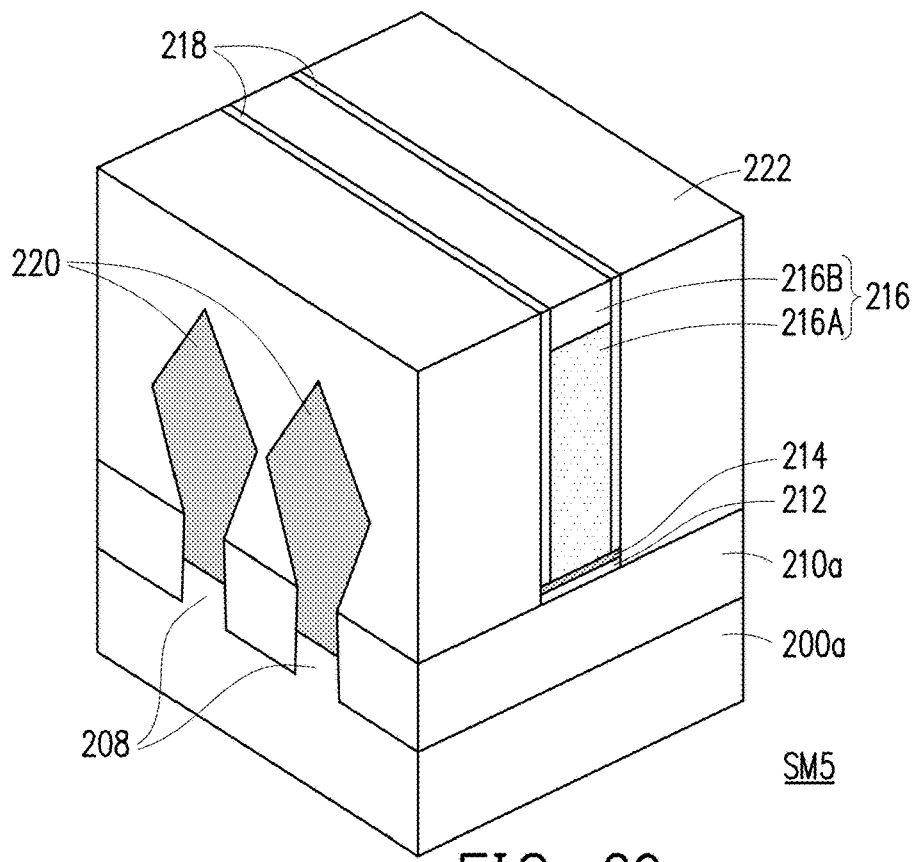

Referring to FIG. 28, in a next step, strained material portions 220 may be formed over the recessed portions Rc of the semiconductor fins 208. In some embodiments, the strained material portions 220 extends beyond the top surfaces of the insulators 210a. The strained material portions 220 is similar to that described in FIG. 10, thus its detailed discussion will be omitted herein. Referring to FIG. 29, the same steps may be performed to form an interlayer dielectric layer 222 on the insulators 210a and covering the strained material portions 220. Subsequently, the dummy gate stack 216 may be removed and replaced with gate stack 224. As such, a semiconductor device SM5 according to some other embodiments of the present disclosure is accomplished.

Figure 30:
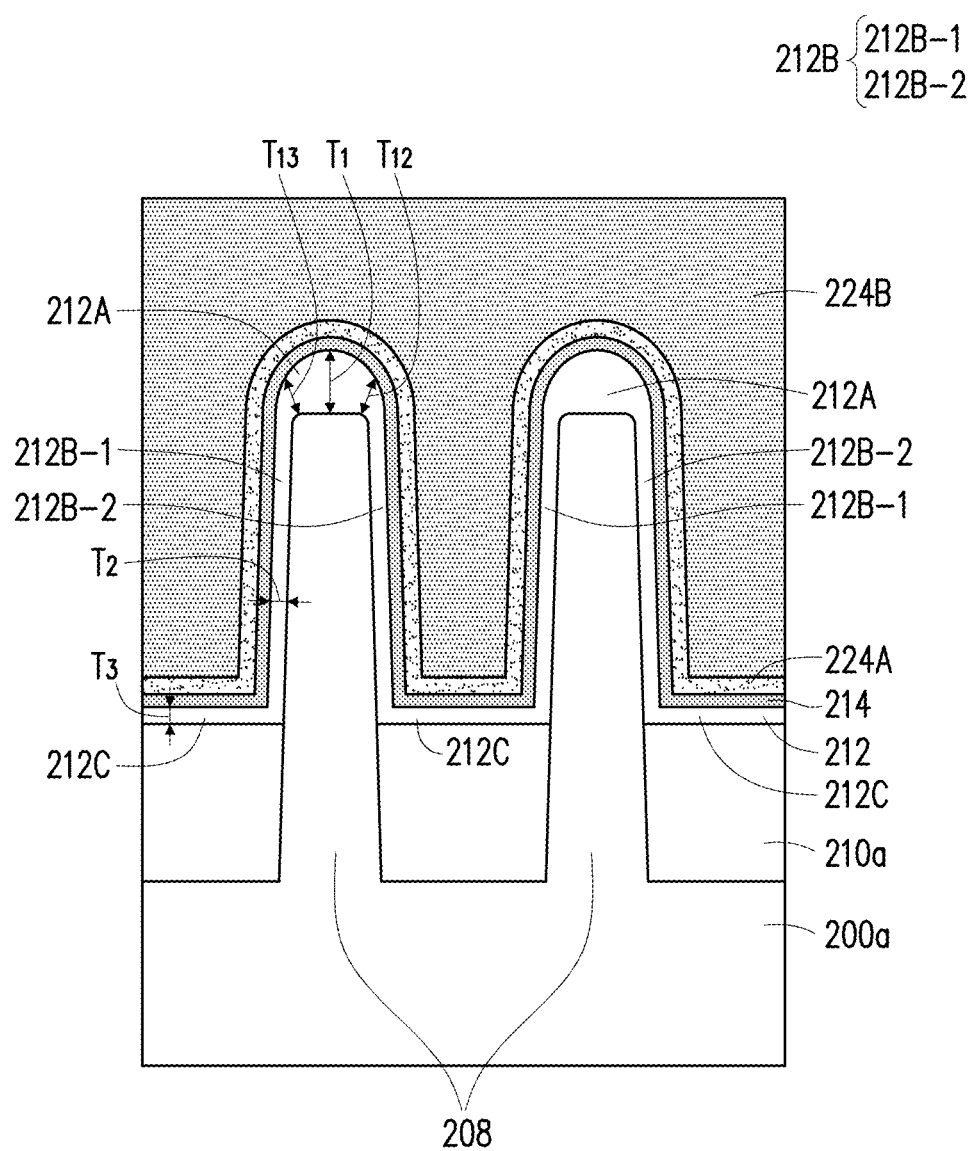
FIG. 30 is a cross-sectional view illustrating a semiconductor device in accordance with some alternative embodiments of the disclosure.

FIG. 30 is a cross-sectional view illustrating a semiconductor device in accordance with some alternative embodiments of the disclosure. The semiconductor device illustrated in FIG. 30 is similar to the semiconductor device SM1 illustrated in FIG. 12B, hence the same reference numerals are used to refer to the same or like parts, and its detailed description will be omitted herein. The difference between the embodiments is in the design of the liner structure 212.

In the previous embodiments, the liner structure 212 is formed with a cap portion 212A having a substantially planar top surface. However, the disclosure is not limited thereto. Referring to FIG. 30, the cap portion 212A of the liner structure 212 has a curved top surface. In the exemplary embodiment, a tip of the cap portion 212A has the maximum thickness $T_1$, while a side of the cap portion 212A joined with the first sidewall portion 212B-1 has thickness $T_{13}$, and another side of the cap portion 212A joined with the second sidewall portion 212B-2 has thickness $T_{12}$. The thicknesses $T_{12}$ and $T_{13}$ being smaller than the thickness $T_1$. In other words, a thickness of the liner structure 212 increases from the first sidewall portion 212B-1 to the cap portion 212A and decreases from the cap portion 212A to the second sidewall portion 212B-2.

Figure 31:
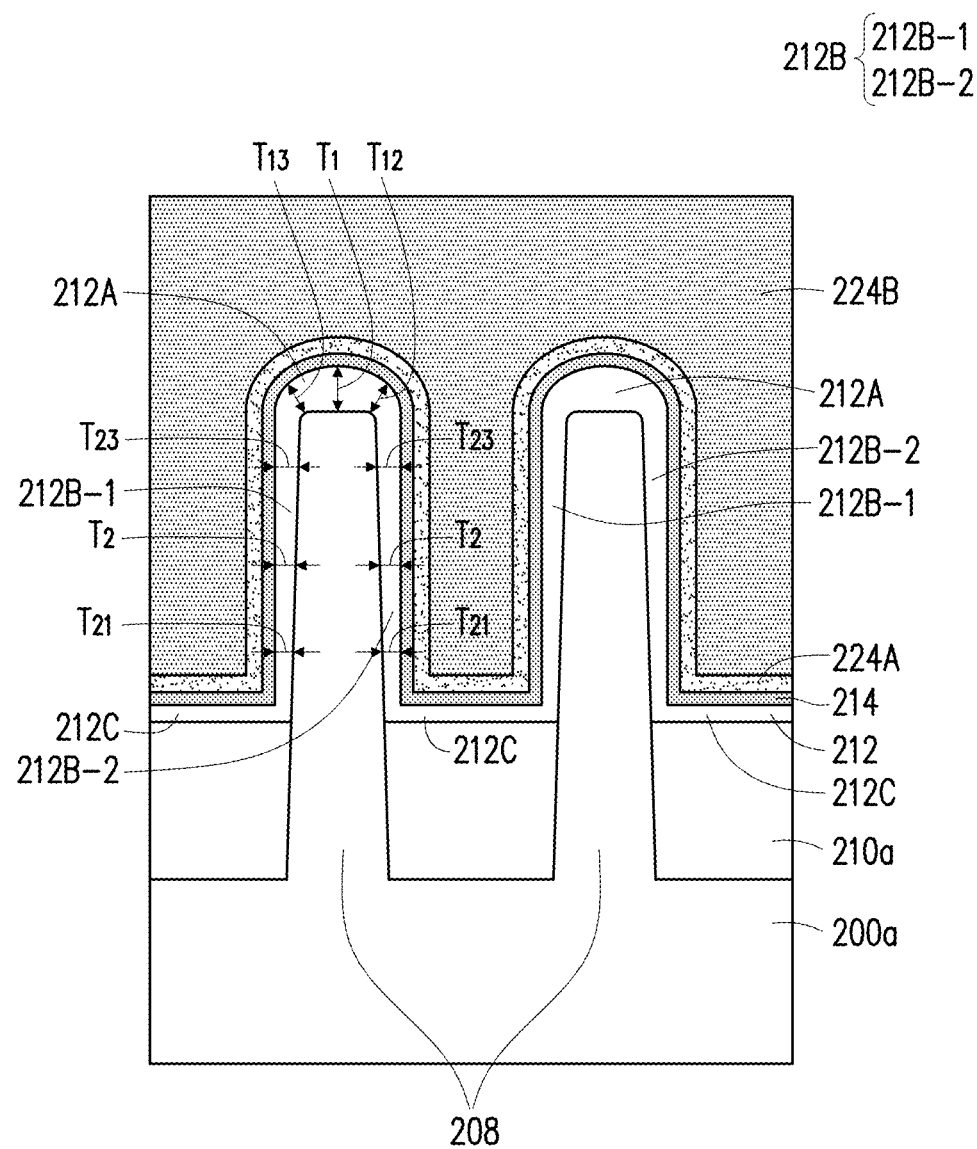
FIG. 31 is a cross-sectional view illustrating a semiconductor device in accordance with some alternative embodiments of the disclosure.

FIG. 31 is a cross-sectional view illustrating a semiconductor device in accordance with some alternative embodiments of the disclosure. The semiconductor device illustrated in FIG. 31 is similar to the semiconductor device SM1 illustrated in FIG. 12B and similar to the semiconductor device illustrate in FIG. 30, hence the same reference numerals are used to refer to the same or like parts, and its detailed description will be omitted herein. The difference between the embodiments is in the design of the liner structure 212.

In the previous embodiments, the liner structure 212 is formed with sidewall portions 212B having substantially the same thickness along the sidewalls of the semiconductor fins 208. However, the disclosure is not limited thereto. Referring to FIG. 22, besides having a cap portion 212A with the curved top surface, a side of the first sidewall portion 212B-1 and the second sidewall portion 212B-2 joined with the base portions 212C has a thickness $T_{21}$, and another side of the first sidewall portion 212B-1 and the second sidewall portion 212B-2 joined with the cap portion 212A has a thickness $T_{23}$. The thickness $T_{21}$ being smaller than the thickness $T_2$, while the thickness $T_{23}$ is greater than the thickness $T_2$. In other words, in the exemplary embodiment, a thickness of the liner structure 212 gradually increases from the base portion 212C to the first sidewall portion 212B-1 and to the cap portion 212A, and gradually decreases from the cap portion 212A to the second sidewall portion 212B-2 and to the base portion 212C.

In the above-mentioned embodiments, since the morphology of the liner structure is modified to include a cap portion with greater thickness, the liner structure may act to prevent over-etching on the semiconductor fins or the formation of pits on the semiconductor fins. Furthermore, in situations where the semiconductor fins need to be further recessed, over-etching of the semiconductor fins or uneven etching of the semiconductor fins may be prevented when forming the recess. In other words, the strained material portion may be formed over the semiconductor fins having more smooth and planar surfaces due to liner structure protection. Overall, a semiconductor device having less defects and improved performance may be achieved.

In accordance with some embodiments of the present disclosure, a semiconductor device includes a substrate, a plurality of insulators, a liner structure and a gate stack. The substrate has fins and trenches in between the fins. The insulators are disposed within the trenches of the substrate. The liner structure is disposed on the plurality of insulators and across the fins, wherein the liner structure comprises sidewall portions and a cap portion, the sidewall portions is covering sidewalls of the fins, the cap portion is covering a top surface of the fins and joined with the sidewall portions, and a maximum thickness $T_1$ of the cap portion is greater than a thickness $T_2$ of the sidewall portions. The gate stack is disposed on the liner structure and across the fins.

In accordance with some other embodiments of the present disclosure, a semiconductor device includes a substrate, insulators, a liner structure, a gate stack and strained material portions. The substrate includes at least one fin, wherein the fin comprises a channel region and source/drain regions. The insulators are disposed on the substrate and located on two sides of the fin. The liner structure is disposed on the insulators and over the channel region of the fin, wherein the liner structure comprises a first sidewall portion, a second sidewall portion and a cap portion, the first sidewall portion and the second sidewall portion are covering sidewalls of the fin, the cap portion is covering a top surface of the fin and joining the first sidewall portion to the second sidewall portion, and a thickness of the liner structure increases from the first sidewall portion to the cap portion and decreases from the cap portion to the second sidewall portion. The gate stack is disposed on the liner structure and across the channel region of the fin. The strained material portions are disposed on the source/drain regions of the fin.

In accordance with yet another embodiment of the present disclosure, a method of fabricating a semiconductor device is described. The method includes the following steps. A substrate is provided. The substrate is patterned to form trenches in the substrate and fins between the trenches. A plurality of insulators is formed in the trenches of the substrate. A liner structure is formed on the plurality of insulators and across the fin. The liner structure is formed by performing a deposition process and a plasma treatment process. The deposition process is performed by introducing a plurality of precursors over a surface of the plurality of insulators and on the fins to form a liner layer. The plasma treatment process is performed on the liner layer to form the liner structure, wherein after the plasma treatment process, the liner structure is formed to include sidewall portions, base portions and a cap portion, the sidewall portions are covering sidewalls of the fins, the cap portion is covering a top surface of the fins and joined with the sidewall portions, the base portions are covering the plurality of insulators and joined with the sidewall portions, and a maximum thickness $T_1$ of the cap portion is greater than a thickness $T_2$ of the sidewall portions. A gate stack is formed on the liner structure and across the fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate comprising at least one fin, wherein the fin comprises a channel region and source/drain regions;
insulators disposed on the substrate and located on two sides of the fin;
a liner structure disposed on the insulators and over the channel region of the fin, wherein the liner structure comprises a first sidewall portion, a second sidewall portion and a cap portion, the first sidewall portion and the second sidewall portion are covering sidewalls of the fin, the cap portion is covering a top surface of the fin and joining the first sidewall portion to the second sidewall portion, and a thickness of the liner structure increases from the first sidewall portion to the cap portion and decreases from the cap portion to the second sidewall portion;
a gate stack disposed on the liner structure and across the channel region of the fin;
strained material portions disposed on the source/drain regions of the fin; and
an interlayer dielectric layer disposed on the insulators and covering the strained material portions, wherein the interlayer dielectric layer is contacting side surfaces of the liner structure.

2. The semiconductor device according to claim 1, wherein the liner structure further includes base portions covering the insulators and joined with the first sidewall portion and the second sidewall portion over the channel region of the fin, wherein a thickness of the base portions is substantially equal to a thickness of the first sidewall portion and a thickness of the second sidewall portion.

3. The semiconductor device according to claim 1, wherein the gate stack comprises a gate dielectric layer disposed over the liner structure, and a gate electrode layer disposed on the gate dielectric layer, and the gate dielectric layer is physically separated from the liner structure.

4. The semiconductor device according to claim 1, further comprising a dielectric layer conformally covering the liner structure and across the channel region of the fin, wherein the dielectric layer is located in between the liner structure and the gate stack.

5. The semiconductor device according to claim 4, further comprising spacer structures located on two sides of the gate stack and over the dielectric layer, wherein side surfaces of the spacer structures are aligned with side surfaces of the dielectric layer.

6. The semiconductor device according to claim 1, wherein the cap portion of the liner structure is further disposed over the source/drain regions of the fin and sandwiched in between the strained material portions and the fin.

7. The semiconductor device according to claim 1, further comprising:
a capping layer located on the channel region and the source/drain regions of the fins, wherein the liner structure is located in between the capping layer and the gate stack in the channel region, and the strained material portions are covering the capping layer in the source/drain regions.

8. A semiconductor device, comprising:
a substrate having fins and trenches in between the fins;
a plurality of insulators disposed within the trenches of the substrate;
a liner structure disposed on the plurality of insulators and across the fins, wherein the liner structure comprises sidewall portions and a cap portion, the sidewall portions is covering sidewalls of the fins, the cap portion is covering a top surface of the fins and joined with the sidewall portions, and a maximum thickness $T_1$ of the cap portion is greater than a thickness $T_2$ of the sidewall portions;
a gate stack disposed on the liner structure and across the fins, wherein the gate stack comprises a gate dielectric layer disposed over the liner structure, and a gate electrode layer disposed on the gate dielectric layer;
a dielectric layer conformally covering the liner structure and across the fins, wherein the dielectric layer is located in between the liner structure and the gate stack; and
spacer structures located on two sides of the gate stack and over the dielectric layer, wherein side surfaces of the spacer structures are aligned with side surfaces of the dielectric layer.

9. The semiconductor device according to claim 8, wherein the maximum thickness $T_1$ and the thickness $T_2$ satisfies the relationship: $0.08 \leq [(T_1-T_2)/T_2] \leq 0.26$.

10. The semiconductor device according to claim 8, wherein the liner structure further includes base portions covering the plurality of insulators and joined with the sidewall portions, wherein a thickness $T_3$ of the base portions is substantially equal to the thickness $T_2$ of the sidewall portions.

11. The semiconductor device according to claim 8, wherein a thickness of the dielectric layer is maintained to be the same along the sidewall portions and the cap portion of the liner structure.

12. The semiconductor device according to claim 8, wherein the cap portion of the liner structure has a curved top surface.

13. The semiconductor device according to claim 8, further comprising strained material portions located on the fins and on two sides of the gate stack, wherein the strained material portions are in contact with the side surfaces of the spacer structure and the side surfaces of the dielectric layer.

14. The semiconductor device according to claim 8, wherein the dielectric layer is sandwiched between the gate dielectric layer and the liner structure.

15. The semiconductor device according to claim 8, further comprising an interlayer dielectric layer disposed on the plurality of insulators and surrounding the spacer structures.

16. A method of fabricating a semiconductor device, comprising:
providing a substrate;
patterning the substrate to form trenches in the substrate and fins between the trenches;
forming a plurality of insulators in the trenches of the substrate;
forming a liner structure on the plurality of insulators and across the fins, wherein the liner structure is formed by:
performing a deposition process by introducing a plurality of precursors over a surface of the plurality of insulators and on the fins to form a liner layer;
performing a plasma treatment process on the liner layer to form the liner structure, wherein after the plasma treatment process, the liner structure is formed to include sidewall portions, base portions and a cap portion, the sidewall portions are covering sidewalls of the fins, the cap portion is covering a top surface of the fins and joined with the sidewall portions, the base portions are covering the plurality of insulators and joined with the sidewall portions, and a maximum thickness $T_1$ of the cap portion is greater than a thickness $T_2$ of the sidewall portions;

forming a dielectric layer conformally covering the liner structure and across the fins;

forming a gate stack on the liner structure, over the dielectric layer and across the fins, wherein the gate stack comprises a gate dielectric layer formed over the liner structure, and a gate electrode layer formed on the gate dielectric layer, and the dielectric layer is located in between the liner structure and the gate stack; and forming spacer structures located on two sides of the gate stack and over the dielectric layer, wherein side surfaces of the spacer structures are aligned with side surfaces of the dielectric layer.

17. The method according to claim 16, wherein the plasma treatment process includes treating the liner layer with a plasma selected from the group consisting of helium, argon, oxygen and hydrogen for 20 to 40 seconds under a source power of 500 W to 1500 W.

18. The method according to claim 16, further comprising:

forming a dummy layer covering the dielectric layer;

patterning the dummy layer to form a dummy gate stack on the dielectric layer and across the fins;

forming spacer structures on two sides of the dummy gate stack;

patterning the dielectric layer so that side surfaces of the dielectric layer are aligned with side surfaces of the spacer structure; and forming the gate stack by replacing the dummy gate stack with the gate stack.

19. The method according to claim 16, wherein the deposition process is a plasma-enhanced atomic layer deposition process, and the plurality of precursors is silicon-containing precursors.

20. The method according to claim 19, wherein the plasma-enhanced atomic layer deposition process is performed at a plasma power of 500 W to 650 W.

* * * * *